(12) United States Patent
Shirasaka

(10) Patent No.: US 7,319,042 B2
(45) Date of Patent: Jan. 15, 2008

(54) METHOD AND APPARATUS FOR MANUFACTURE AND INSPECTION OF SEMICONDUCTOR DEVICE

(75) Inventor: Kenichi Shirasaka, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 608 days.

(21) Appl. No.: 10/313,033

(22) Filed: Dec. 6, 2002

(65) Prior Publication Data

US 2003/0143780 A1    Jul. 31, 2003

(30) Foreign Application Priority Data

Dec. 7, 2001 (JP) ............................. 2001-374323
Mar. 28, 2002 (JP) ............................. 2002-093179

(51) Int. Cl.
*H01L 21/66* (2006.01)
*H01L 21/00* (2006.01)
*G01R 31/26* (2006.01)

(52) U.S. Cl. ..................... 438/15; 438/112; 438/125; 438/127; 257/E21.504; 257/E23.124; 257/787

(58) Field of Classification Search ................. 438/15, 438/112, 125, 127; 257/787, E21.504, E23, 257/124

See application file for complete search history.

(56) References Cited

U.S. PATENT DOCUMENTS 6,294,824 B1    9/2001  Brooks et al.

FOREIGN PATENT DOCUMENTS

| JP | 59-78536 | 5/1984 |
|---|---|---|
| JP | 4-225241 | 8/1992 |
| JP | 6-29340 | 2/1994 |
| JP | 7-60782 | 3/1995 |
| JP | 7-161747 | 6/1995 |
| JP | 7-169786 | 7/1995 |
| JP | 10-64933 | 3/1998 |
| JP | 10-189631 | 7/1998 |
| JP | 2000-3923 | 1/2000 |
| JP | 2001-185569 | 7/2001 |
| JP | 2001-228192 | 8/2001 |

*Primary Examiner*—Matthew Smith
*Assistant Examiner*—Jarrett J Stark
(74) *Attorney, Agent, or Firm*—Dickstein Shapiro LLP

(57) ABSTRACT

A semiconductor device is manufactured in such a way that a semiconductor chip connected with leads whose internal ends are interconnected with bonding wires are completely sealed and enclosed in a resin corresponding to a package while external ends of leads are exposed from the surface of the package. In manufacture, a chip fixing member is used to fix the semiconductor chip in a prescribed position, while wire fixing members are used to fix the bonding wires in prescribed positions. Both the fixing members are retracted into the split mold so as to avoid formation of unfilled portions or voids in the resin in the cavity. In inspection, an electrical conduction is detected between the bonding wire (s) and an electrode layer formed inside of the cavity, so that a semiconductor device produced in the cavity is automatically removed from the manufacturing line.

4 Claims, 17 Drawing Sheets

METHOD AND APPARATUS FOR MANUFACTURE AND INSPECTION OF SEMICONDUCTOR DEVICE

BACKGROUND OF THE INVENTION

1. Field of the Invention

This invention relates to methods and apparatuses for manufacture and inspection of semiconductor devices such as semiconductor chips encapsulated in packages.

2. Description of the Related Art

In general, semiconductor devices such as semiconductor chips are sealed and enclosed in packages, wherein internal ends of leads are connected with semiconductor chips by bonding wires, while external ends of leads are exposed outside of the exteriors of packages. That is, semiconductor chips, bonding wires, and internal ends of leads are all combined together and are integrally sealed within resins corresponding to packages.

FIG. 29 shows an example of a conventional manufacturing process of a semiconductor device, wherein a semiconductor chip 1 is mounted on a stage 6 of a frame 8, in which the prescribed number of leads 2 are arranged. Herein, pads 1a of the semiconductor chip 1 are connected with internal ends 2a of the leads 2 by bonding wires 3. Thus, a frame assembly 9 is produced and is set into a mold unit 100.

The mold unit 100 comprises a mold body 111 consisting of split molds 111a and 111b, which are split and vertically combined together, a cavity 112 formed inside of the mold body 111, and a pair of a runner 114 and a gate 115 that are used for injection of a resin, which is solidified to form a package. The split molds 111a and 111b are controlled in temperature and are also capable of holding external ends 2b of the leads 2 in an airtight manner by a mold drive apparatus (not shown). The cavity 112 is formed in a prescribed shape defining the exterior configuration of a package enclosing a semiconductor device. The runner 114 and the gate 115 form a passage for injecting unhardened thermosetting resin compounds (hereinafter, simply referred to as resin) into the cavity 112, so that they are formed and arranged along a split plane between the molds 111a and 111b. Specifically, one end of the runner 114 is communicated with a heating pot having a plunger (not shown), and the gate 115 is opened at a prescribed position of the cavity 112.

The aforementioned frame assembly 9 is set into the mold unit 100, which is then closed. Then, a resin is injected into the cavity 112 by way of the runner 114 and the gate 115, so that the cavity 112 is completely filled with the resin. Thereafter, the injected resin is gradually hardened in the cavity 112 at prescribed temperature, which is maintained for a while. After completion of hardening of the resin, the mold unit 100 is opened, so that the frame assembly 9 sealed with the resin is extracted therefrom. The external ends 2b of the leads 2 are subjected to cutting so that the frame assembly 9 is separated from the frame 8. Thus, it is possible to produce a semiconductor device enclosed in a resin package.

The aforementioned manufacturing method may have a drawback in the resin filling process in which during the injection of the resin, the bonding wires 3 are deformed inside of the cavity 112. Specifically, in the resin filling process in which the resin is injected into the cavity 112 from the gate 115, the bonding wires 3 that are normally comprised of very thin metal wires are pressed by flows of the resin and are deformed or twisted in the cavity 112. This may cause defective contacts, short-circuits, and breaks of the bonding wires 3 as well as unwanted occurrence of voids in the resin. Occasionally, the bonding wires 3 may be exposed outside of the exterior surface of the resin.

Japanese Unexamined Patent Publication No. Hei 10-189631 discloses an example of a method for preventing bonding wires from being exposed outside of the exterior surface of a package. This publication teaches pressing of bonding wires in the cavity as shown in FIG. 28, wherein a cavity modifying portion 220 is additionally provided with respect to a mold unit 220 consisting of split molds 211a and 211b, which are combined together to form a cavity 212 therein. Specifically, the cavity modifying portion 220 is arranged for the upper mold 211a of the mold unit 200 and is descended down into the cavity 212, so that top portions of bonding wires 3 are regulated in heights prior to resin injection. In this state, a resin is injected into the cavity 212 via a resin flow passage 221 that is formed to penetrate through the cavity modifying portion 220. After filling the cavity 212 with the resin but before completion of hardening of the resin in the cavity 212, the cavity modifying portion 220 is pulled upwards to a prescribed height corresponding to the surface of a package, which causes an unfilled space formed inside of the cavity 212. Then, such a space is further filled with the resin. In this method, however, the bonding wires 3 are pressed by flows of the resin into the cavity 212, so that they may be deformed or twisted to cause unwanted contacts, short-circuits, and breaks of the bonding wires as well as occurrence of voids in the resin. In addition, it may be unrealistic to inject the resin into the cavity 212 via the resin flow passage 221 formed in the cavity modifying portion 220 because of the thermosetting property of the resin, which is hardened inside of the cavity 212 and is also irreversibly hardened inside of the resin flow passage 221.

Through studies on causes of deformations of bonding wires inside of the cavity of the mold unit, we the inventors have ascertained a main cause of deformations of bonding wires, which will be described with reference to FIG. 29. During the process of injecting the resin into the cavity 112 whose space is gradually filled with the resin, the resin having a high viscosity presses the semiconductor chip 1 together with the stage 6 of the frame 8 (not shown), so that the semiconductor chip 1 is forced to be moved from the prescribed position thereof. Such unexpected movement of the semiconductor chip 1 in the cavity 112 causes a bonding wire 3X to be partially exposed on a side wall of the package and also causes a bonding wire 3Y to be twisted in the cavity 112, which in turn cause unwanted contacts, short-circuits, and breaks of bonding wires as well as occurrence of voids in the resin. These defects of bonding wires may be detected as defective products; however, they can be eliminated in manufacture by conduction inspections detecting short-circuits and/or breaks. When the number of defective products increases, the productivity is noticeably reduced. In addition, not all defective products are always detected by normal conduction inspections, and some of them may be shipped as good products, for which defectiveness will be indicated or claimed after the shipment. In that case, manufactured products are greatly reduced in reliability.

SUMMARY OF THE INVENTION

It is an object of the invention to provide a method and an apparatus for manufacture and inspection of semiconductor devices, from which defects due to deformations of bonding wires during resin injection processes can be reliably eliminated and which are noticeably improved in productivity and reliability.

It is another object of the invention to provide a method and an apparatus for manufacture and inspection of semiconductor devices, in which defectiveness of bonding wires, which are exposed outside of surfaces of packages or which are approached very close to surfaces of packages, can be reliably detected in sealing processes for sealing semiconductor chips with resins.

In a first aspect of the present invention, the manufacturing method of a semiconductor device is comprised of five processes, namely, a frame assembly process, a mold setup process, a chip fixation process, a resin filling process, and a resin solidification process. After a frame assembly containing a semiconductor chip whose leads are interconnected with bonding wires is set into a mold unit comprising a pair of split molds, the mold unit is closed, then, at least one chip fixing member accommodated in the split mold is inserted into and projected in the cavity to press the semiconductor chip, which is thus temporarily fixed in position in the cavity. The resin filling process is comprised of two steps, namely, resin injection and chip fixing member retraction, wherein before the cavity of the mold unit is completely filled with the resin, the chip fixing member is retracted into the split mold, so that the retracted trace will be further filled with the resin. Herein, it is possible to provide the prescribed number (e.g., four) of chip fixing members corresponding to pins, rip ends of which are attached with buffer members. The chip fixing member can be brought into contact with the prescribed position (e.g., corner) of the semiconductor chip. Alternatively, it can be brought into contact with the stage of the frame on which the semiconductor chip is mounted, or it can be brought into contact with the stage bar for supporting the stage of the frame.

In the above, the chip fixing process can be comprised of two steps, namely, semiconductor chip fixation using at least one chip fixing member and bonding wire fixation using at least one wire fixing member. That is, the semiconductor chip is fixed in position by the chip fixing member, while the bonding wire is also fixed in position by the wire fixing position, which is inserted into the cavity to press the bonding wire. Herein, the tip end of the bonding wire has a curved shape that substantially matches the curved top portion of the bonding wire. It is possible to provide the prescribed number of wire fixing members, which respectively press the bonding wires connected with the leads of the semiconductor chip. Thereafter, before the cavity of the mold unit is completely filled with the resin, both the chip fixing member and wire fixing member are retracted into the split mold, so that retracted traces will be further filled with the resin.

In a second aspect of the invention, the split molds of the mold unit are insulated from each other via insulation layers, and an electrode layer is formed on the interior wall of the cavity with respect to one split mold. When the semiconductor chip is moved upwardly in the resin filling process so that the bonding wire(s) is unexpectedly brought into contact with the electrode layer in the cavity, an electrical conduction therebetween is detected so that information regarding the identification number of the cavity of the mold unit is recorded and its molded product (i.e., semiconductor device) is determined to be a defective product in which the bonding wire(s) is actually exposed from the surface of the package or could be possibly exposed from the surface of the package after shipment. In response to the information, such defective product is automatically removed from the manufacturing line. Thus, it is possible to reliably detect sealing defects of packages of semiconductor devices, which may not be detected in normal inspections.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
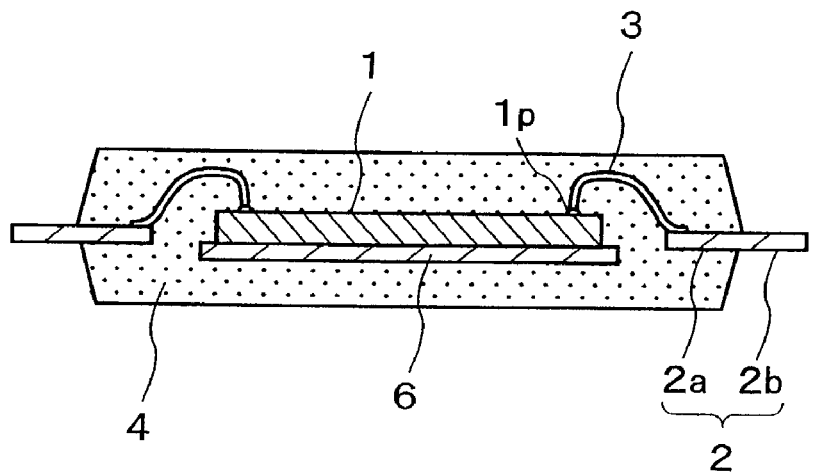
FIG. 1 is a cross sectional view showing the internal structure of a semiconductor device that is manufactured in accordance with the preferred embodiment of the present invention.

FIG. 1 is a cross sectional view showing the internal structure of a semiconductor device that is manufactured in accordance with a first embodiment of the invention. The semiconductor device of FIG. 1 contains a semiconductor chip 1 entirely enclosed and sealed within a package 4, which is made of thermosetting resin compounds. Herein, pads 1p formed on the semiconductor chip 1 are connected with internal end 2a of leads via bonding wires 3 corresponding to thin metal wires. Therefore, all of the aforementioned elements (i.e., the semiconductor chip 1, internal ends 2a of the leads 2, and bonding wires 3) are integrally combined and completely enclosed in the package 4, while external ends 2b of the leads 2 are exposed from the exterior surface of the package 4. The semiconductor chip 1 is arranged roughly at the center of the package 4, wherein the lower surface thereof is adhered to a stage 6, while the upper surface thereof accommodates electric circuits.

The semiconductor device of the present embodiment is manufactured by the following apparatus and method, which will be described below.

Figure 2:
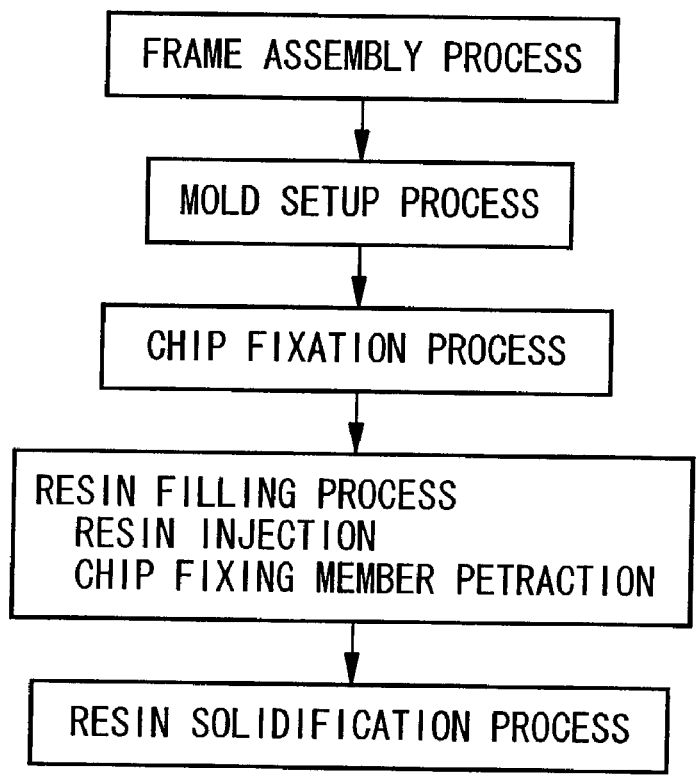
FIG. 2 is a flowchart diagrammatically showing an example of processes for use in manufacture of a semiconductor device in accordance with the preferred embodiment of the present invention.

FIG. 2 shows the outline of the manufacture of the semiconductor device of the present embodiment, which is constituted by five processes, namely, a frame assembly process, a mold setup process, a chip fixation process, a resin filling process, and a resin solidification process. Three processes out of five processes, namely, mold setup process, resin filling process, and resin solidification process, are performed using a mold unit and a mold drive apparatus in accordance with the present embodiment. Details of the aforementioned five processes will be described below.

(a) Frame Assembly Process

Figure 3:
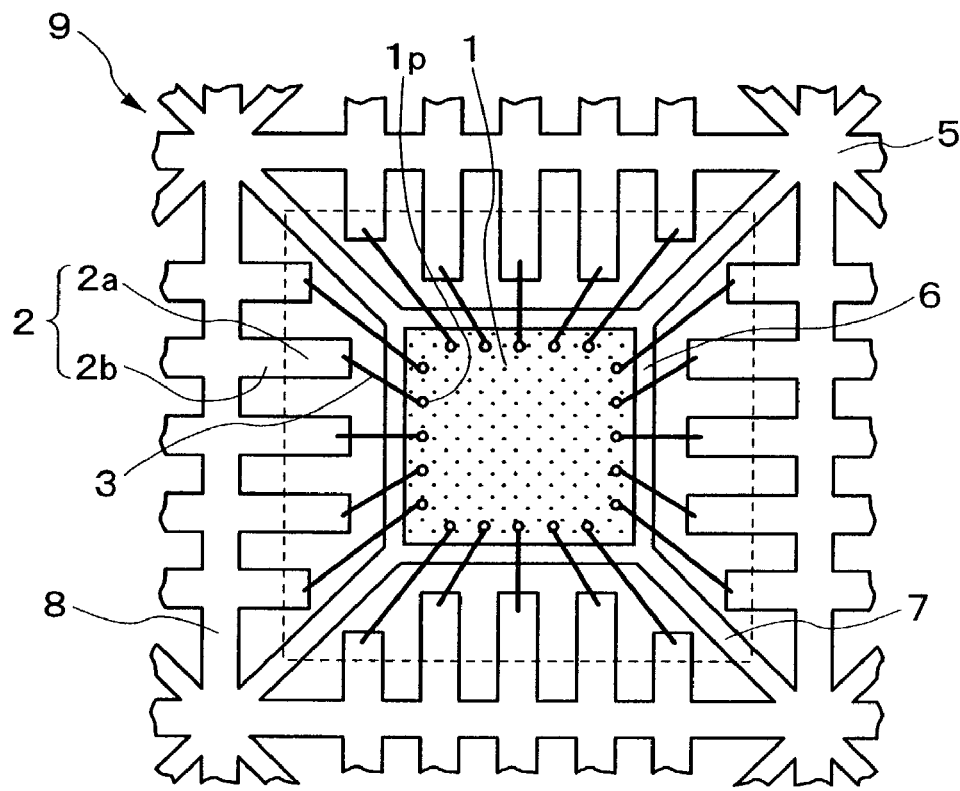
FIG. 3 is a plan view showing the exterior appearance of a frame assembly including a semiconductor chip, which is produced in a frame assembly process shown in FIG. 2.

FIG. 3 is a plan view showing an exterior appearance of a frame assembly 9 whose parts are assembled together in the frame assembly process. The frame assembly 9 is constituted by the semiconductor chip 1, the bonding wires 3, and a frame 5, which is constituted by the stage 6 mounting the 'rectangular' semiconductor chip 1 thereon, four stage bars 7 for bridging and supporting the stage 6, and four lead stays 8 for supporting arrangements of the leads 2. This frame 5 integrally comprised of the stage 6, stage bars 7, and lead stays 8 is formed by pressing and cutting a metal plate.

At first, the semiconductor chip 1 is mounted on and is adhered to the stage 6. Then, the pads 1p of the semiconductor chip 1 are connected with the internal ends 2b of the leads 2 by the bonding wires 3. Thus, it is possible to produce the frame assembly 9.

(b) Mold Setup Process

Figure 4:
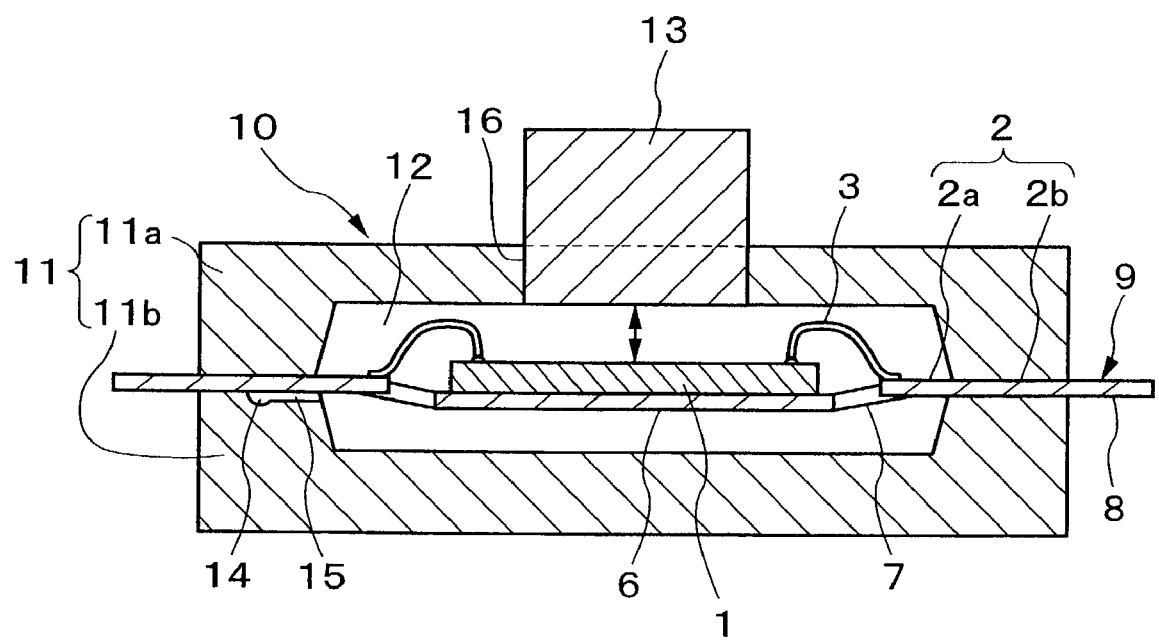
FIG. 4 is a cross sectional view showing the internal structure of a mold unit holding the frame assembly, which is established in the last stage of a mold setup process shown in FIG. 2 in accordance with a first embodiment of the invention.

FIG. 4 is a cross sectional view showing the internal structure of a mold unit 10, which holds and contains the frame assembly 9 in the last step of the mold setup process. The mold setup process uses a semiconductor device manufacturing apparatus comprising the mold unit 10 and a mold drive apparatus (not shown).

The mold unit 10 has a pair of split molds (i.e., an upper mold 11a and a lower mold 11b), which are split and vertically combined together, a cavity 12, and a chip fixing member 13 as well as a runner 14 and a gate 15 that supply a resin for use in formation of a package into the cavity 12. Both the upper mold 11a and lower mold 11b are controlled in temperatures by the mold drive apparatus (not shown), and they have prescribed channels matching shapes and patterns of the leads 2 and stage bars 7 of the frame assembly 9 at their split planes. That is, the external ends 2b of the leads 2 and the external ends of the stage bars 7 are held in an airtight manner between the upper mold 11a and the lower mold 11b. The cavity 12, which is formed inside of the mold unit 10 when the upper mold 11a and lower mold 11b are combined together, has a prescribed shape defining the exterior configuration of the package 4. The chip fixing member 13 corresponding to a prismatic or cylindrical block is arranged in the upper mold 11a of the mold unit 10 and is conformed with a through hole 16 penetrating through the upper mold 11a. The chip fixing member 13 can be moved vertically while sliding along side walls of the through hole 16, so that it can be partially inserted into the cavity 12 or extracted from the cavity 12. The insertion and extraction timings and strokes of the chip fixing member 13 are controlled by the aforementioned mold driving apparatus. The runner 14 and the gate 15 form a passage for use in injection of an unhardened thermosetting resin into the cavity 12, wherein they are formed on split planes of the upper mold 11a and lower mold 11b. One end of the runner 14 is communicated with a heating pot having a plunger (not shown), and the gate 15 is opened at a prescribed position of the cavity 12. Herein, the prescribed amount of resin pellets are melted in the heating pot, so that the melted resin is injected into the cavity 12 via the runner 14 and gate 15 while pressed by the plunger, for example.

The aforementioned frame assembly 9 is set in the mold unit 10. Firstly, the mold unit 10 is opened, then, the frame assembly 9 is arranged at the prescribed position between the upper mold 11a and lower mold 11b. At this time, all the external ends 2b of the leads 2 and the external ends of the stage bars 7 of the frame assembly 9 are held between the upper mold 11a and lower mold 11b. In addition, the semiconductor chip 1 mounted on the stage 6, the bonding wires 3, and the internal ends 2a of the leads 2 are located inside of the cavity 12, wherein they are connected together without having contacts with internal walls of the cavity 12. After the setup of the frame assembly 9, the mold unit 10 is closed.

(c) Chip Fixation Process

Figure 5:
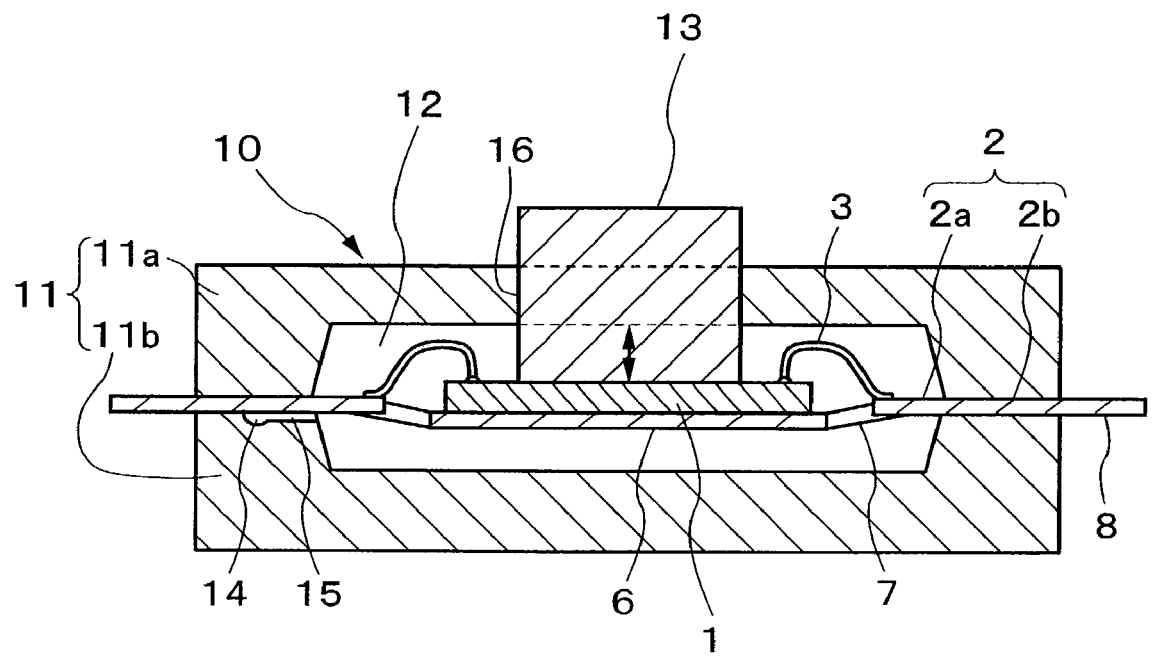
FIG. 5 is a cross sectional view showing the internal structure of the mold unit holding the frame assembly whose semiconductor chip is pressed by a chip fixing member, which is established in the last stage of a chip fixation process shown in FIG. 2 in accordance with the first embodiment of the invention.

FIG. 5 is a cross sectional view showing the mold unit 10 holding the frame assembly 9 whose semiconductor chip 1 comes in contact with the chip fixing member 13, which is established in the last stage of the chip fixation process. After the frame assembly 9 is set into the mold unit 10 that is closed, the chip fixing member 13 that is inserted into the through hole 16 of the upper mold 11a is descended down to project into the cavity 12, so that the lower end portion of the chip fixing member 13 is brought into contact with the upper surface of the semiconductor chip 1, the lower surface of which is adhered to the(stage 6 supported by the mold unit 10 via the stage bars 7. Thus, the semiconductor chip 1 is sandwiched between the chip fixing member 13 and the stage 6, so that it is temporarily fixed in position.

Figure 6:
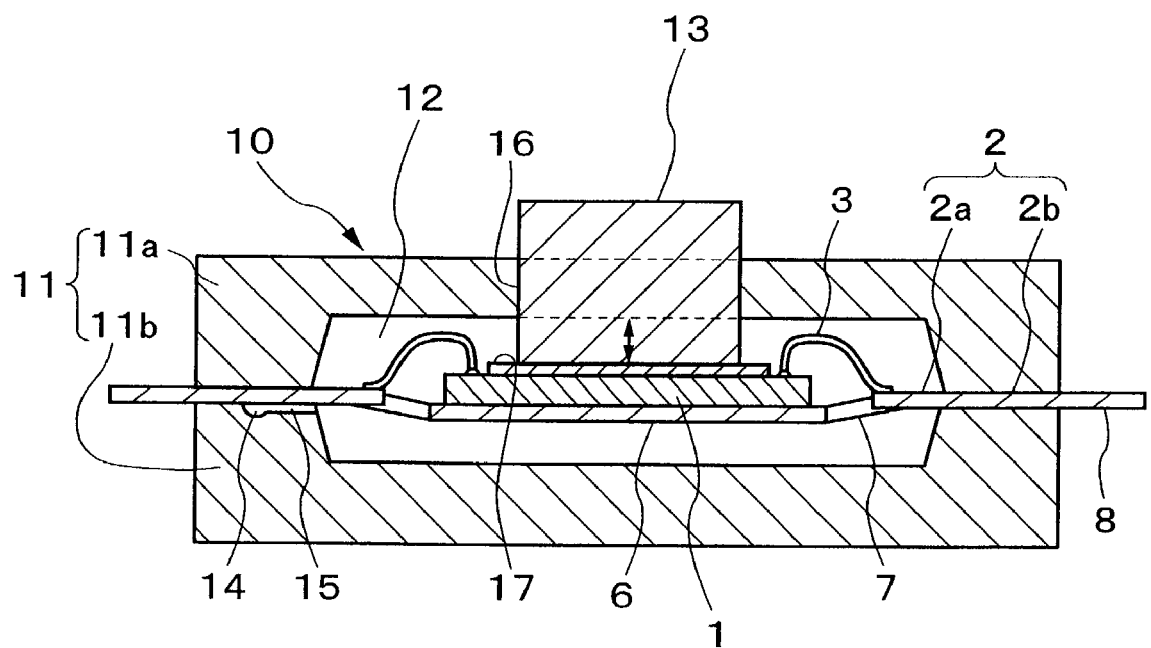
FIG. 6 is a cross sectional view showing a modified example of the internal structure of the mold unit holding the frame assembly whose semiconductor chip is pressed by the chip fixing member via a protective film.

If there is a possibility of damaging the electric circuits of the semiconductor chip 1 due to the contact with the lower end portion of the chip fixing member 13, it is preferable to adhere a protective film 17 (see FIG. 6) onto the surface of the semiconductor chip 1 prior to the chip fixation process.

(d) Resin Filling Process

The resin filling process contains two steps, namely, resin injection and chip fixing member retraction. First, an unhardened thermosetting resin is injected into the cavity 12, in which the semiconductor chip 1 is temporarily fixed in position, via the runner 14 and the gate 15. Before the cavity 12 is completely filled with the resin, the chip fixing member 13 is retracted in the through hole 16 of the upper mold 11a in such a way that the lower end surface thereof matches the interior wall of the cavity 12. Due to the retraction of the chip fixing member 13, the inside space of the cavity 12 is placed at a negative pressure but is immediately filled with the resin, so that no voids or holes occur in the resin supplied to the cavity 12. At this stage, the semiconductor chip 1 has already been embedded in the resin, so that the surrounding areas thereof are uniformly pressured by the resin. Therefore, even when the positional fixation using the chip fixing member 13 is released, the semiconductor chip 1 may not move in position due to the flow pressure of the resin. All the resin injection speed, injection pressure, the retraction start timing of the chip fixing member 13, and retraction speed are optimally controlled in response to the temperature of the mold unit 10 by the mold drive apparatus.

(e) Resin Solidification Process

Figure 7:
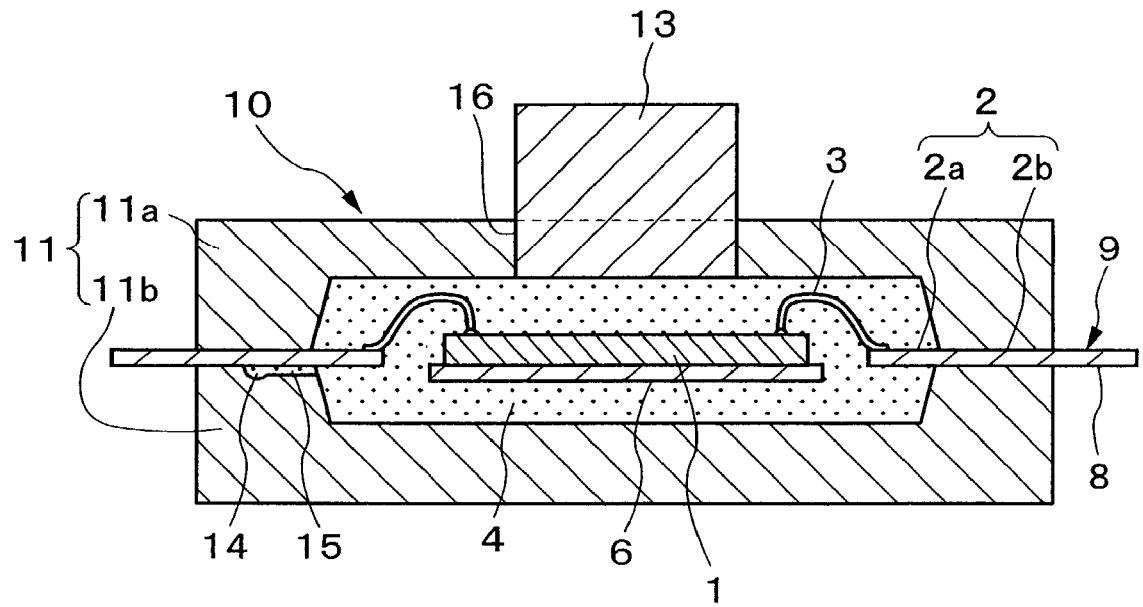
FIG. 7 is a cross sectional view showing the internal structure of the mold unit in which the semiconductor chip is enclosed in a resin, which is established in the last stage of the resin solidification process shown in FIG. 2 in accordance with the first embodiment of the invention.

FIG. 7 is a cross sectional view showing the mold 10 whose cavity 12 is completely filled with the resin enclosing the semiconductor chip 1, which is established at the last stage of the resin solidification process. In the resin solidification process, the resin filling the cavity 12 of the mold unit 10 is hardened and solidified. Due to the thermosetting property of the resin, the resin is irreversibly solidified by continuous heating, thus forming the package 4 inside of the mold unit 10. At this time, the resin is also hardened in the runner 14 and gate 15, which are both formed on the split plane of the lower mold 11b. Therefore, when the mold unit 10 is opened, the hardened resin in the runner 14 and gate 15 can be easily removed from the mold unit 10 together with the package 4.

After the completion of the solidification of the resin in the cavity 12, the mold unit 10 is opened, and the frame assembly 9 is extracted therefrom. Then, the lead stays 8 are cut out from the leads 2, and the stage bars 7 projecting from the package 4 are also cut out. Thus, it is possible to obtain the semiconductor device of the present embodiment, wherein it is possible to reliably prevent the semiconductor chip 1 from moving unexpectedly due to the flow pressure of the resin in the resin injection process. Herein, it is possible to reliably suppress occurrence of contacts, short-circuits, and breaks of the bonding wires 3 due to deformations in the package 4 as well as exposure of the bonding wires 3 due to the unexpected movement of the semiconductor chip 1 in the resin. Therefore, the present embodiment can noticeably improve the reliability and productivity in manufacture of the semiconductor device.

2. Second Embodiment

The second embodiment is basically similar to the first embodiment except the special shape and structure of chip fixing members. Hence, the second embodiment is described in particular with respect to the shape and structure of chip fixing members.

Figure 8:
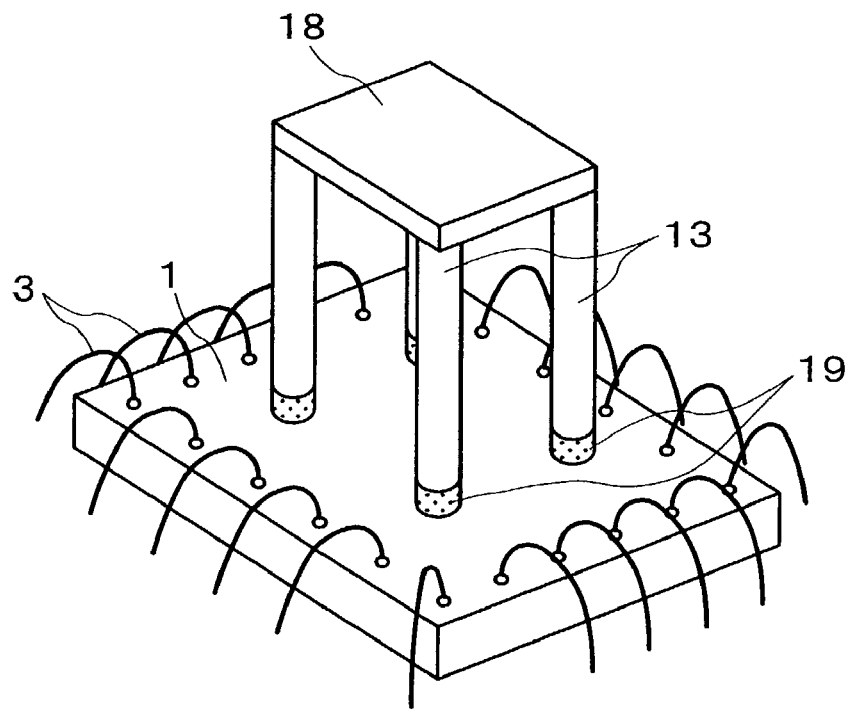
FIG. 8 is a perspective view showing chip fixing members that are brought into contact with the semiconductor chip in accordance with a second embodiment of the invention.
Figure 9:
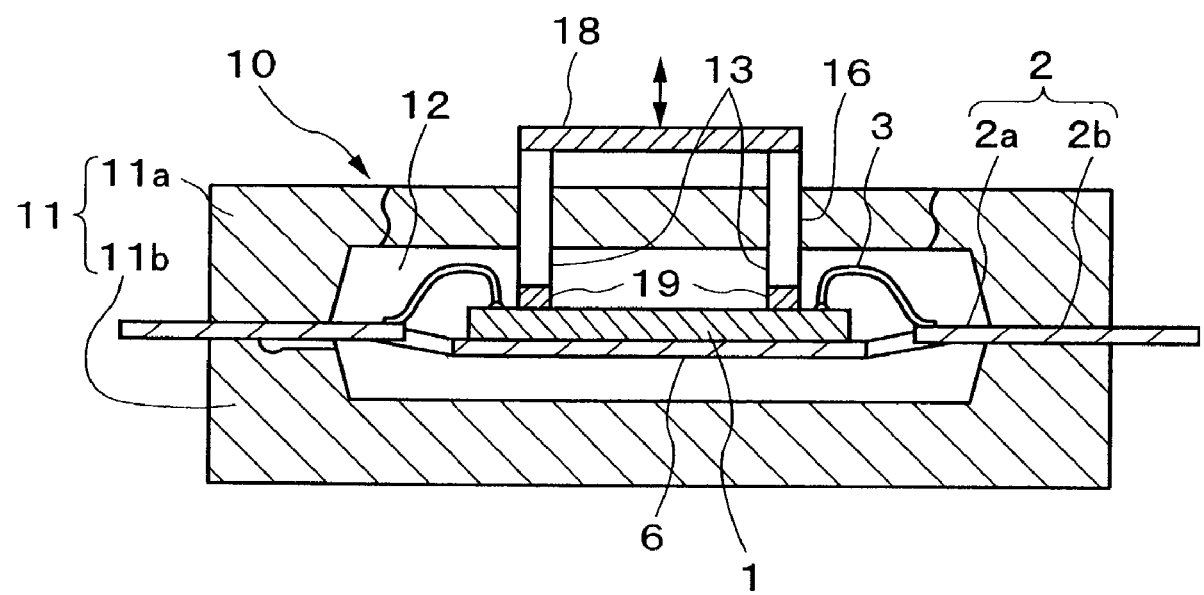
FIG. 9 is a cross sectional view showing the mold unit holding the frame assembly whose semiconductor chip is pressed by the chip fixing members shown in FIG. 8.

FIGS. 8 and 9 shows the structure and usage of the chip fixing members in accordance with the second embodiment of the invention. That is, the second embodiment provides four chip fixing members 13 each corresponding to a cylindrical pin, the tip end of which is attached with a cushion or buffer member 19. The buffer member 19 is made of heat-resistant rubber or synthetic resin. The four chip fixing members 13 are respectively planted at four corners of a square or rectangular seat 18 and are interlocked with each other. These chip fixing members 13 are inserted into through holes 16 formed at prescribed positions of the upper mold 11a, so that they can be freely inserted into or extracted from the cavity 12 while sliding interior walls of the through holes 16. By pressing the seat 18 that is normally arranged outside of the mold unit 10, the four chip fixing members 13 are inserted into the cavity 12 so that the buffer members 19 are respectively brought into contact with four corners of the semiconductor chip 1, which is pressed downwardly.

Figure 10:
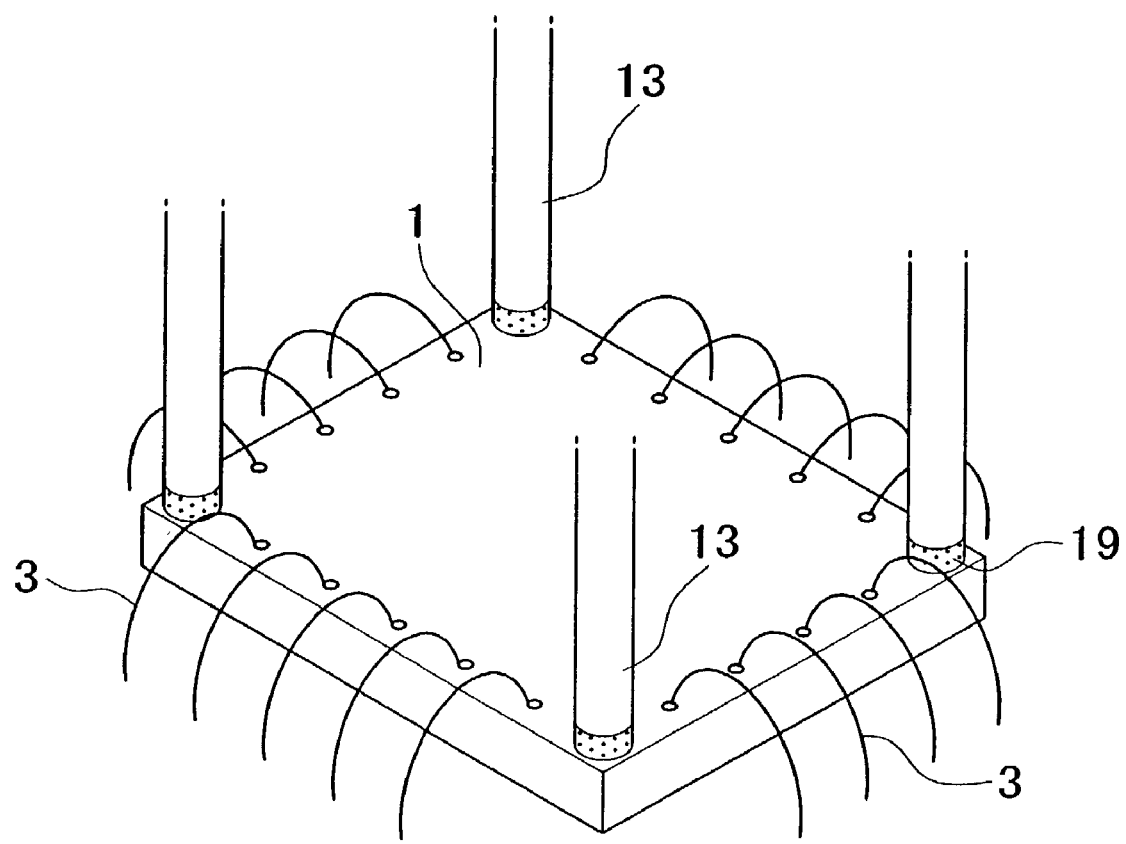
FIG. 10 is a perspective view showing the chip fixing members that are brought into contact with four corners of the semiconductor chip.
Figure 11:
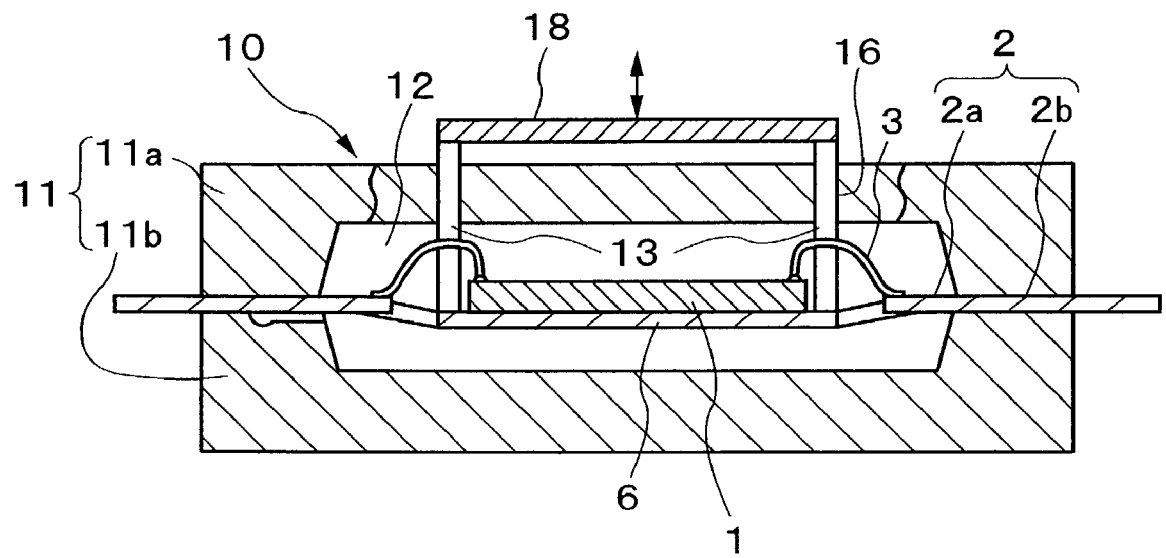
FIG. 11 is a cross sectional view showing the internal structure of a mold unit holding a frame assembly whose stage is pressed downwardly by chip fixing members in accordance with a third embodiment of the invention.
Figure 12:
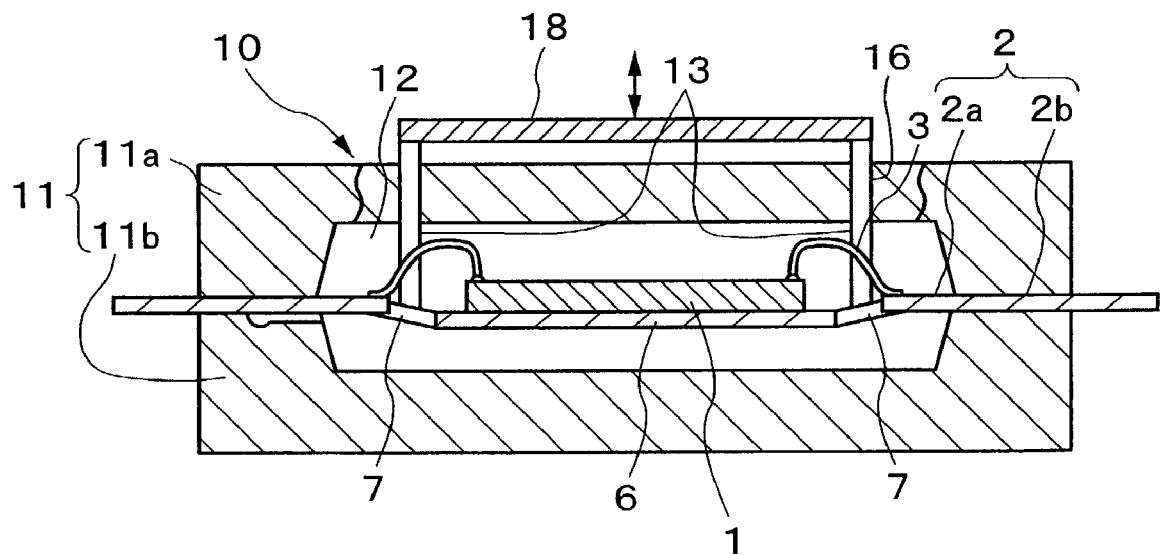
FIG. 12 is a cross sectional view showing a modified example of the internal structure of the mold unit holding the frame assembly whose stage bars are pressed downwardly by the chip fixing members.

Since no bonding wire is arranged in four corners of the semiconductor chip 1, no problems occur when the chip fixing members 13 are brought into contact with four corners of the semiconductor chip 1 as shown in FIG. 10. That is, the second embodiment ensures the semiconductor chip 1 to be reliably pressed without problem.

The chip fixing members 13 are each constituted by a thin pin, which does not disturb or interrupt the flow of the resin injected into the cavity 12 of the mold unit 10. Therefore, even though the resin is injected into the cavity 12 of the mold unit 10 at a relatively high speed, there occurs no turbulence in the flow of the resin, which may noticeably reduce the probability of the occurrence of voids in the resin. That is, it is possible to improve the yield and reliability in manufacture of semiconductor devices. Due to the provision of the buffer members 19 at the tip ends of the chip fixing members 13, there may be substantially no possibility of damaging circuit elements and components on the semiconductor chip 1, which the chip fixing members 13 are brought into contact with.

3. Third Embodiment

The third embodiment is basically similar to the second embodiment, wherein four chip fixing members each corresponding to a cylindrical pin are used to press the frame assembly 9 held by the mold unit 10.

Similar to the second embodiment, the four chip fixing members 13 are planted on four corners of the square or rectangular seat 18 and are interlocked with each other, wherein they are freely inserted into or extracted from the cavity 12 of the mold unit 10 while sliding interior walls of through holes 16, which are formed at prescribed positions of the upper mold 11a of the mold unit 10. By pressing the seat 18 downwardly, the tip ends of the chip fixing members 13 are respectively brought into contact with four corners of the stage 6, which is pressed downwardly. That is, the third embodiment is characterized in that the chip fixing members 13 are not directly brought into contact with the semiconductor chip 1 but are brought into contact with the stage 6.

Since the third embodiment is designed in such a way that the chip fixing members 13 are respectively brought into contact with the four corners of the stage 6, it is possible to indirectly and temporarily fix the semiconductor chip 1 in the prescribed position due to the adhesion of the semiconductor chip 1 onto the stage 6. Therefore, the chip fixing members 13 do not damage circuit elements or components fabricated in the semiconductor chip 1. In addition, the chip fixing members 13 each constituted by a thin pin do not disturb or interrupt the flow of the resin injected into the cavity 12 of the mold unit 10. This may noticeably reduce the probability of the occurrence of voids in the resin due to turbulence even though the resin is injected into the cavity 12 of the mold unit 10 at a relatively high speed. Thus, it is possible to improve the yield and reliability in manufacture of semiconductor devices.

The third embodiment can be modified in such a way that the chip fixing members 13 are brought into contact with the stage bars 7 corresponding to neighborhoods of the stage 6. Such a modification ensures the semiconductor chip 1 to be temporarily fixed in position without causing damage to circuit elements and also ensures high-speed injection of the resin into the cavity 12 of the mold unit 10. In this case, the chip fixing members 13 are placed relatively far from the semiconductor chip 1 held in the cavity 12 of the mold unit 10. This may contribute to smooth flow of the resin particularly in the surrounding areas of the semiconductor chip 1, which ensures reliable formation of a package having a high precision and uniformity.

4. Fourth Embodiment

The fourth embodiment is substantially identical to the second embodiment except that wire fixing members are provided to temporarily fix the bonding wires 3 onto the upper mold 11a of the mold unit 10 in prescribed positions, which will be described with reference to FIG. 13.

Figure 13:
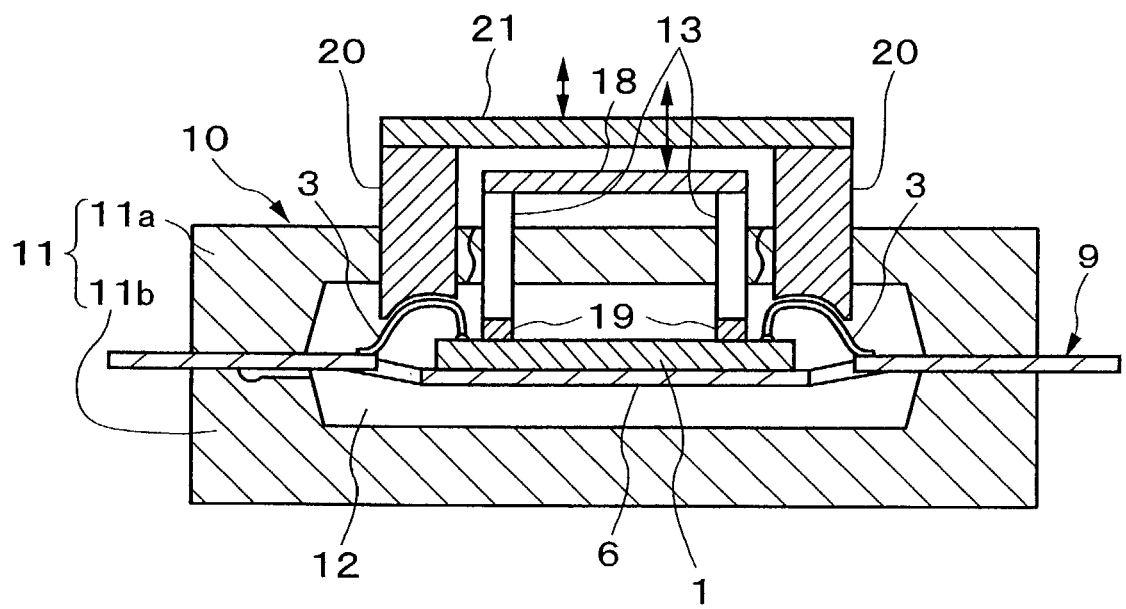
FIG. 13 is a cross sectional view showing the detailed structure of the mold unit providing wire fixing members for fixing bonding wires in prescribed positions inside of the cavity in accordance with a fourth embodiment of the invention.

FIG. 13 shows the detailed structure and configuration of the mold unit 10 in accordance with the fourth embodiment of the invention. That is, the mold unit 10 is characterized by providing wire fixing members 20 for temporarily fixing the bonding wires 3 in prescribed positions. The wire fixing members 20 can be freely inserted into and extracted from the cavity 12 via through holes, which are formed at prescribed positions of the upper mold 11a of the mold unit 10, while sliding interior walls of the through holes. When inserted into the cavity 12 of the mold unit 10, the wire fixing members 20 are projected inside of the cavity 12 and are respectively brought into contact with the curved top portions of the bonding wires 3. For this reason, the tip end portions of the wire fixing members 20 are shaped in prescribed curves substantially matching the curved top portions of the bonding wires 3 in the cavity 12 of the mold unit 10. Outside of the mold unit 10, the other ends of the wire fixing members 20 are interconnected with a seat 21 and are interlocked with each other.

Figure 14:
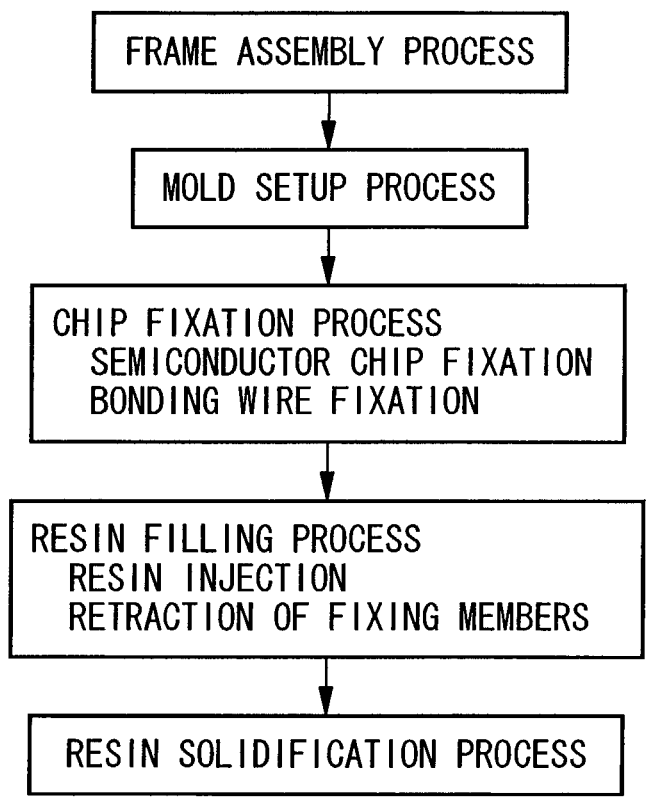
FIG. 14 is a flowchart showing the outline of a manufacturing method of a semiconductor device in accordance with the fourth embodiment of the invention.

FIG. 14 is a flowchart showing the outline of a manufacturing method of the present embodiment, which is constituted by five processes, namely, the frame assembly process, mold setup process, chip fixation process, resin filling process, and resin solidification process similar to the foregoing manufacturing method shown in FIG. 2. Compared with the foregoing manufacturing method shown in FIG. 2, the manufacturing method of FIG. 14 is characterized by the chip fixation process that is performed after completion of the mold setup process in which the frame assembly 9 is set into the mold 10, which is then closed. Specifically, the chip fixation process contains two steps, namely, semiconductor chip fixation and bonding wire fixation. Herein, the semiconductor chip fixation step substantially corresponds to the foregoing process of the second embodiment, wherein the four chip fixing members 13 are respectively brought into contact with the neighboring areas of the four corners of the semiconductor chip 1, which is pressed downwardly and is thus temporarily fixed in position. The chip fixing members 13 are each constituted by a thin pin, which does not disturb or interrupt the flow of the resin injected into the cavity 12 of the mold unit 10. Therefore, even though the resin is injected into the cavity 12 of the mold unit 10 at a relatively high speed, there is a low probability of occurrence of voids due to the turbulence of the flow of the resin. Thus, it is possible to improve the yield and reliability in manufacture of semiconductor devices. In addition, the chip fixing members 13 are attached with the buffer members 19 at the tip ends thereof; hence, even when the chip fixing members 13 are brought into direct contact with circuit elements of the semiconductor chip 1, there is a low probability of causing damage to the semiconductor chip 1. In the bonding wire fixation step, the wire fixing members 20 are projected into the cavity 12 by prescribed strokes, so that their curved tip ends are brought into slight contact with the curved top portions of the bonding wires 3, which are thus substantially maintained in shapes and positions.

Incidentally, it is not necessary to limit the order of performing the semiconductor chip fixation step and bonding wire fixation step in the chip fixation process. Therefore, these steps can be sequentially performed in an arbitrary order; alternatively, these steps can be performed simultaneously.

The resin filling process contains two steps, namely, resin injection and chip fixing member retraction, which are similar to the foregoing resin filling process shown in FIG. 2. Due to the chip fixation process, both the semiconductor chip 1 and the bonding wires 3 are temporarily fixed in prescribed positions in the cavity 12 of the mold unit 10. In the resin filling process, an unhardened resin is injected into the cavity 12 via the runner 14 and the gate 15. Before the cavity 12 is completely filled with the resin, the chip fixing members 13 and the wire fixing members 20 are retracted in the respective through holes of the upper mold 11a in such a way that the tip ends thereof substantially match the interior walls of the cavity 12. Due to the retraction of the chip fixing members 13, the space of the cavity 12 is placed in negative pressure but is immediately filled with the resin, which reliably avoids occurrence of void and holes in the resin. At this stage, the semiconductor chip 1 and the bonding wires 3 have all been embedded in the resin so that the surrounding areas thereof are uniformly pressured by the resin. Therefore, even when the positional fixation using the chip fixing members 13 and wire fixing members 20 is released, the semiconductor chip 1 and the bonding wires 3 would not be moved or deformed due to the flow pressure of the resin. All the resin injection speed, injection pressure, retraction start timings of the chip fixing members 13 and wire fixing members 20, and retraction speeds are optimally controlled in response to the temperature of the mold unit 10 by the mold drive apparatus. Incidentally, it is not necessary to limit the order of starting retractions of the chip fixing members 13 and wire fixing members 20. That is, the chip fixing member 13 and wire fixing members 20 can be sequentially retracted into the upper mold 11a in an arbitrary order; alternatively, they can be retracted into the upper mold 11a simultaneously. After completion of the resin filling process, the fourth embodiment performs the resin solidification process, the content of which was already described in the first embodiment.

The fourth embodiment is characterized by providing the bonding wire fixation step, in which the bonding wires 3 are fixed in position during the resin injection by projecting the wire fixing members 20 into the cavity 12, in addition to the semiconductor chip fixation step in which the semiconductor chip 1 is temporarily fixed in position by the chip fixing members 13. Therefore, it is possible to reliably avoid occurrence of unwanted contacts, short-circuits, and breaks of the bonding wires due to deformations in the package as well as unexpected exposure of the bonding wires from the exterior surface of the package. Thus, it is possible to further improve the productivity in manufacture of semiconductor devices. The wire fixing members 20 are retracted into the mold unit 10 before the completion of the resin filling process, which ensures retracted traces to be reliably filled with the resin without causing voids or holes in the resin corresponding to the package. In particular, the tip ends of the wire fixing members 20, which are brought into direct contact with the bonding wires 3, are also curved to suit the curves of the bonding wires 3 respectively. This reliably prevents mutual distances between the bonding wires 3 from being unexpectedly changed. That is, the present embodiment can reliably avoid occurrence of mutual contacts between the bonding wires 3 and occurrence of induced modulation due to variations of mutual distances between the bonding wires 3. Thus, it is possible to produce semiconductor devices having uniform characteristics with a relatively high reliability.

Figure 15:
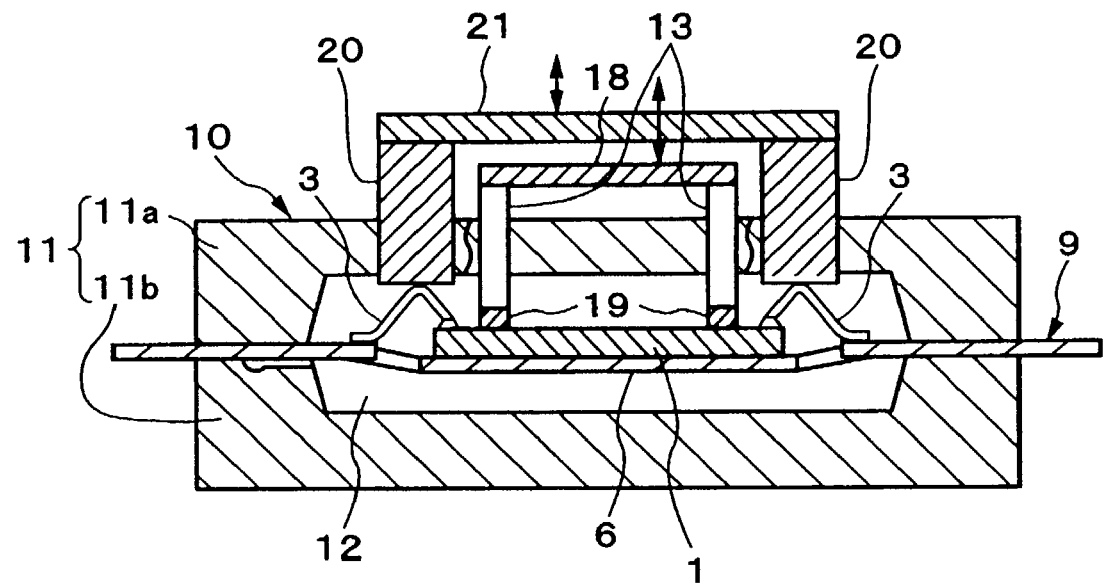
FIG. 15 is a cross sectional view showing a modified example of the structure of the mold unit providing wire fixing members whose tip ends are shaped planar.

The fourth embodiment can be modified as shown in FIG. 15 in which the tip ends of the wire fixing members 20 are shaped to be planar to cope with a so-called flat package, for example. This modification may avoid formation of burrs in the resin. In addition, the wire fixing members 20 can be each attached with a buffer member at the tip end thereof.

Figure 16:
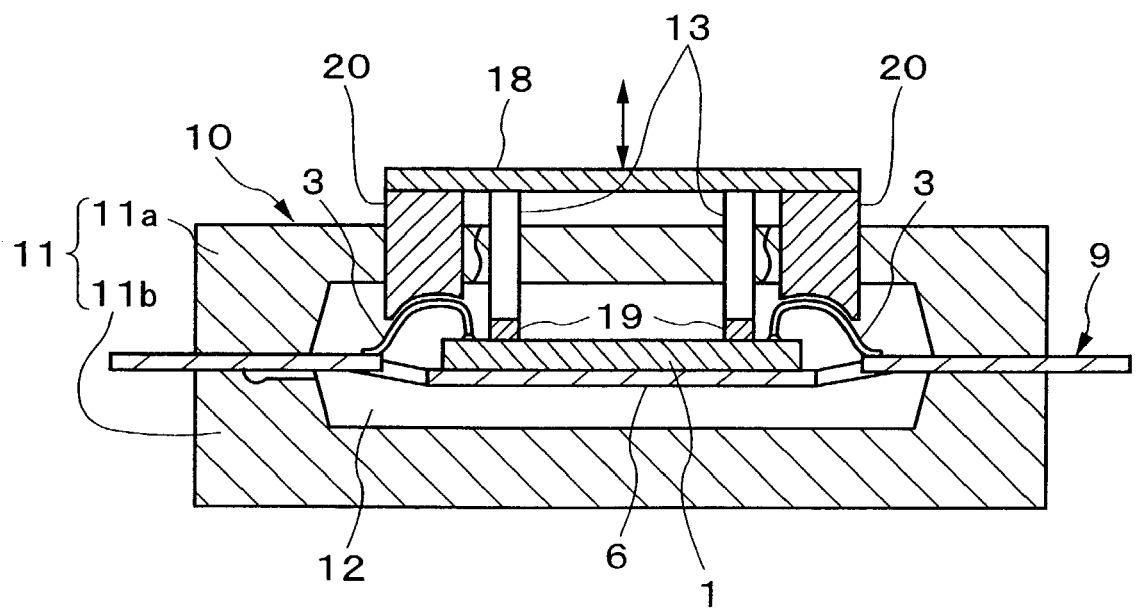
FIG. 16 is a cross sectional view showing a further modified example of the structure of the mold unit in which both the chip fixing members and wire fixing members are interlocked with each other.

The fourth embodiment can be further modified as shown in FIG. 16 in which the seat 18 interlocking the chip fixing members 13 and the seat 21 interlocking the wire fixing members 20 can be integrally combined together, wherein all the chip fixing members 13 and wire fixing members 20 are all connected with a single seat (18) and are interlocked with each other. That is, they can be simultaneously inserted into and extracted from the cavity 12 by the same strokes. In this modification, when retracted into the upper mold 11a of the mold unit 10, the tip ends of the chip fixing members 13 and wire fixing members 20 may not completely match the interior wall of the cavity 12, however, which may not cause substantial damage to characteristics of semiconductor devices and which may not cause substantial damage to the productivity and reliability in manufacture of semiconductor devices. Compared with independent manipulations of the chip fixing members 13 and wire fixing members 20, this modification may greatly contribute to simplifications of structures of molds and control apparatuses as well as reduction of the manufacturing cost of semiconductor devices.

As described above, the first to fourth embodiments have various effects, which will be described below.

The semiconductor chip of the frame assembly, which is bridged in the cavity when held between the upper and lower molds of the mold unit, is temporarily fixed in position by manipulating the chip fixing member(s); then, before completion of the resin filling process for the cavity, the chip fixing member(s) is safely retracted into the upper mold of the mold unit. Therefore, even though the semiconductor chip is pressed by the resin injected into the cavity under the flow pressure, it is possible to reliably avoid unwanted movement of the semiconductor chip inside of the cavity filled with the resin. Thus, it is possible to noticeably suppress occurrence of unwanted contacts, short-circuits, and breaks of bonding wires due to unexpected deformation of the semiconductor chip in the package, and it is possible to reliably prevent bonding wires from being exposed outside of the package. This noticeably improves the productivity in manufacture of semiconductor devices.

In addition to the chip fixing members, it is possible to arrange wire fixing members for fixing bonding wires in positions inside of the cavity of the mold unit. Herein, while the chip fixing members operate to avoid unwanted movement of the semiconductor chip in the cavity filled with the resin, the wire fixing members also operate to suppress deformations of bonding wires due to the flow of the resin injected into the cavity. Therefore, it is possible to noticeably suppress occurrence of unwanted contacts, short-circuits, and breaks of bonding wires due to deformations of bonding wires in the package, and it is possible to reliably prevent bonding wires from being exposed outside of the package. This further improves the productivity in manufacture of semiconductor devices.

5. Fifth Embodiment

Figure 27:
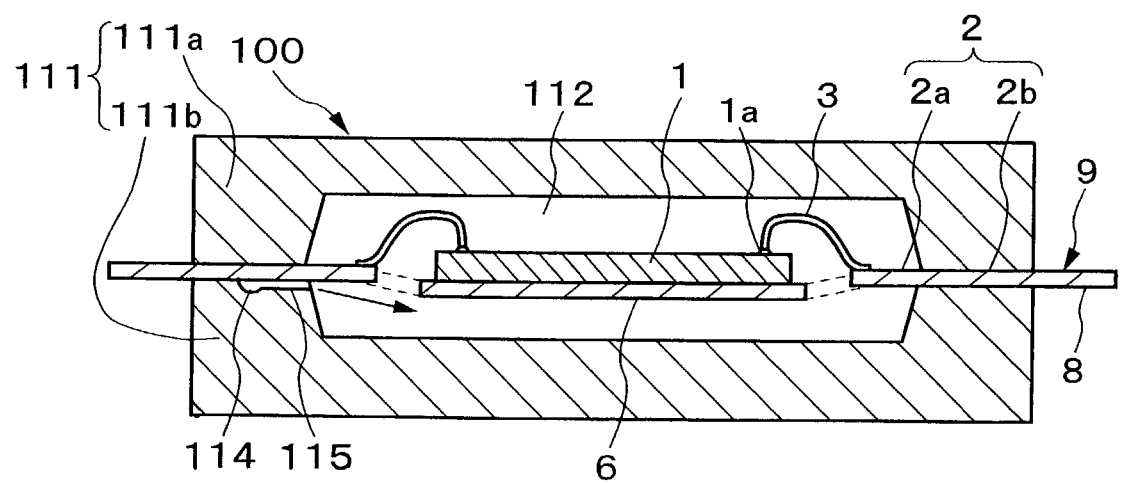
FIG. 27 is a cross sectional view showing the structure of a mold unit for manufacturing a semiconductor device in accordance with the conventional method.
Figure 28:
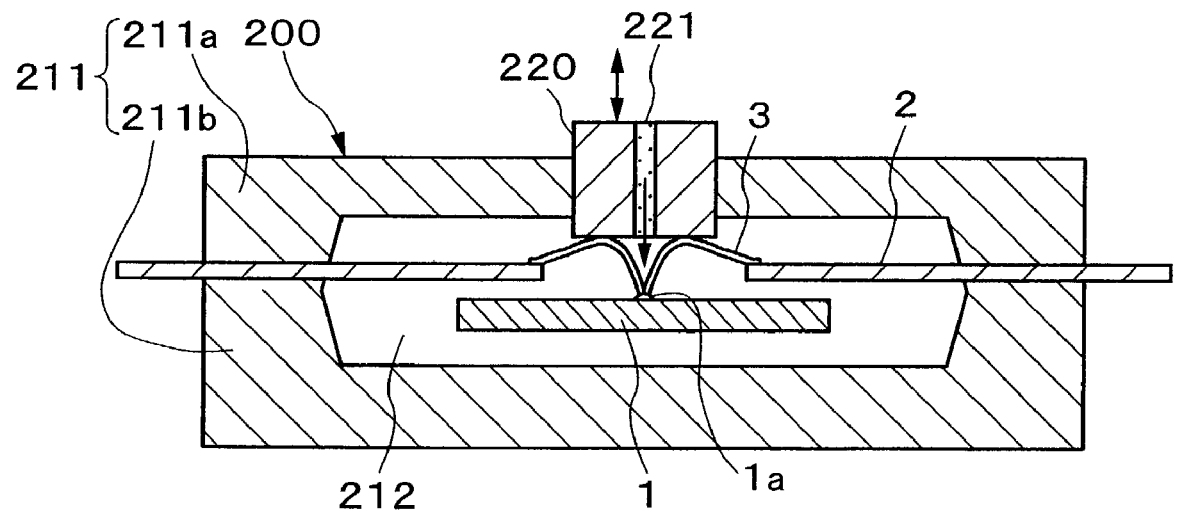
FIG. 28 is a cross sectional view showing the structure of a mold unit having a cavity modifying portion for manufacturing a semiconductor device in accordance with another conventional method.
Figure 29:
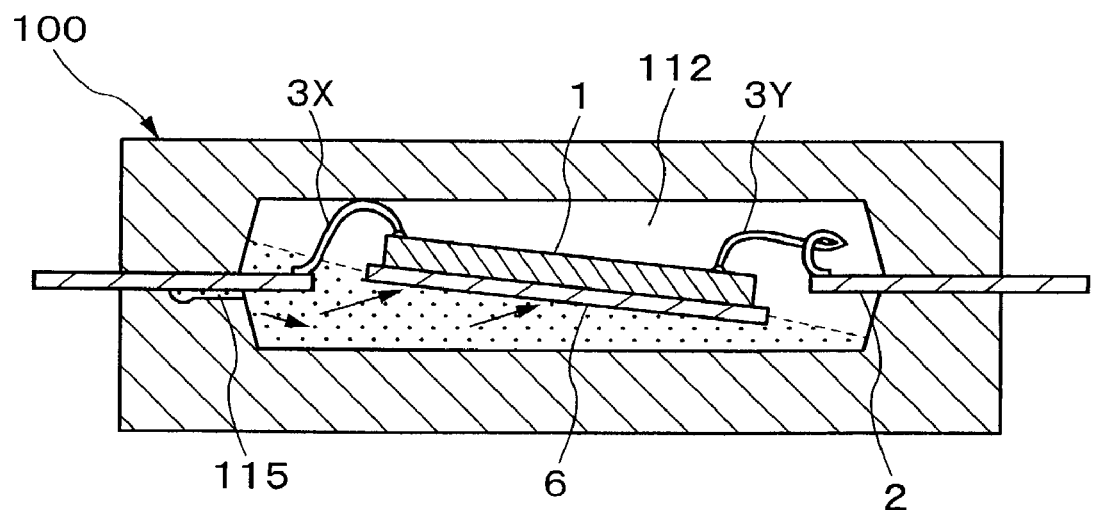
FIG. 29 is a cross sectional view showing the structure of a mold unit for manufacturing a semiconductor device, which is used to describe a problem in the conventional method.

The following embodiments are related in particularly to inspections of semiconductor devices, in which semiconductor chips connected with leads whose internal ends are interconnected with bonding wires corresponding to very thin metal wires are sealed and enclosed in resins corresponding to packages while external ends of leads are exposed outside of packages, which was described with reference to FIG. 27.

Figure 30:
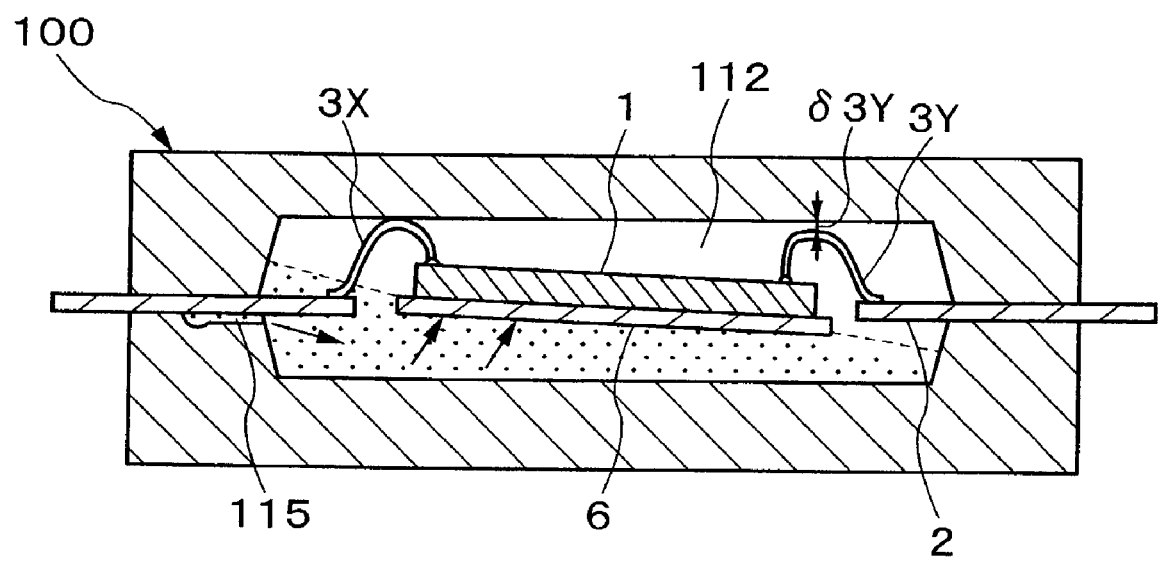
FIG. 30 is a cross sectional view showing the structure of a mold unit in which defectiveness of bonding wires occur inside of the cavity when a semiconductor chip is moved upwards due to the injection flow of a resin.

In the sealing process of the aforementioned manufacturing method of a semiconductor device, the bonding wires 3 are deformed in the cavity 112 during the resin injection, which will be described in detail with reference to FIG. 30. FIG. 30 shows a certain phenomenon in which a part (e.g., curved top portion) of a bonding wire 3X are moved upwards to come in contact with the internal wall of the cavity 112. It is considered that such a phenomenon may occur in the resin filling process, in which the resin is injected into the cavity 112 to fill its space, when the resin having a high viscosity presses up the semiconductor chip 1 together with the stage 6 so that the semiconductor chip 1 is moved from the prescribed position in the cavity 112. If the resin is filled into the cavity 112 whose internal wall is brought into contact with the bonding wire 3X and is hardened, the bonding wire 3X will be exposed outside of the exterior surface of the semiconductor device. In general, an electrical conduction inspection is performed in the manufacturing line with respect to the semiconductor device after completion of the sealing process, wherein when a break or short-circuit is found in the circuit or wiring in the package, the semiconductor device is detected as the defective product, which is then removed from the manufacturing line. However, the electrical conduction inspection cannot detect the defectiveness of the product whose bonding wire(s) is exposed unless other conduction failures such as breaks and short-circuits are found, so that such a defective product may be mistakenly judged to be a good product. After shipment of such a defective product, the exposed portion of the bonding wire of the semiconductor device may come in contact with other electric circuit, or moisture may infiltrate into the semiconductor device from the exposed portion of the bonding wire so that the circuit property will be deteriorated.

Even though no bonding wire is apparently exposed from the exterior surface of the package, when the semiconductor chip 1 is moved upwards during the resin injection process, a margin 8 between the curved top portion of the bonding wire 3Y and the surface of the package becomes small, which may form a thinned portion in the package. This product is also detected as a good product by the normal electrical conduction test performed in the manufacturing line; however, after shipment, when the thinned portion of the package is peeled off, the bonding wire will be exposed outside of the surface of the package, or when humidity is infiltrated into the package from the thinned portion, the circuit property will be deteriorated. That is, when defectiveness of bonding wires of semiconductor devices is not detected by the normal inspection in the manufacturing line and is claimed after shipment, the reliability of the manufacture of semiconductor devices will be damaged very much.

Figure 17:
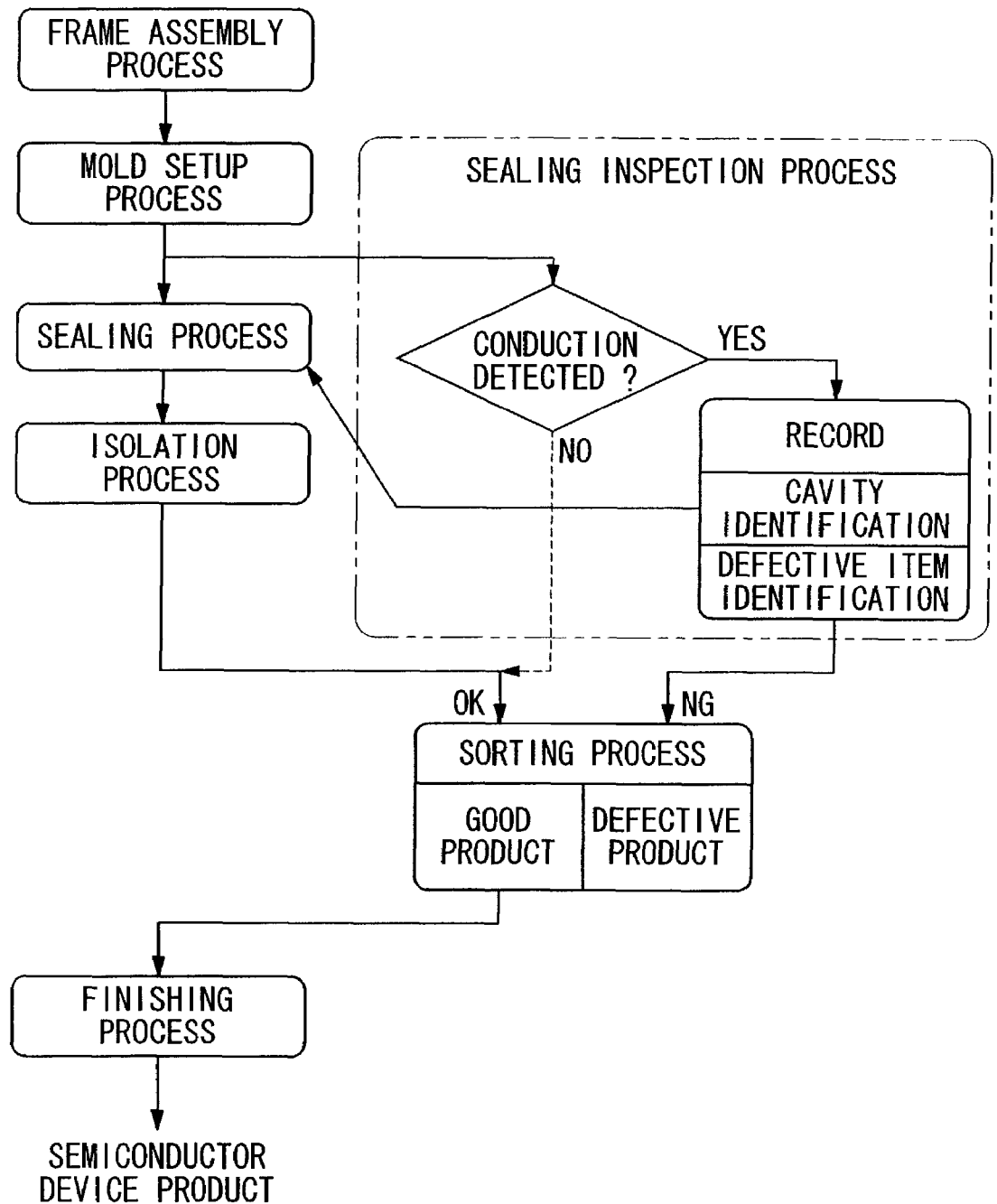
FIG. 17 is a manufacture flow diagram showing a part of a manufacturing line for manufacturing and inspection of semiconductor devices in accordance with a fifth embodiment of the invention.

To solve the aforementioned problems, the fifth embodiment of the present invention provides a brand-new manufacturing line ensuring reliable inspection with respect to defectiveness of bonding wires. FIG. 17 shows a part of the manufacturing line for manufacture and inspection of semiconductor devices. Roughly speaking, this manufacturing line comprises seven processes as follows:

(a) Frame Assembly Process

There is provided a common frame constituted by the prescribed number of units accommodating semiconductor chips respectively. Herein, the semiconductor chips are respectively connected with leads, which are formed in the corresponding units of the common frame, via bonding wires, thus forming a multiple frame assembly in which multiple units of frame assemblies are arranged in a serial or matrix form.

(b) Mold Setup Process

The frame assemblies are set into a mold assembly arranging multiple pairs of split molds having cavities, wherein each frame assembly is placed on the split surface between the corresponding molds, and then the spit molds are closed.

(c) Sealing Process

Resins used for sealing semiconductor chips are injected into cavities. After cavities are completely filled with resins, the resins are hardened, and then the split molds are opened.

(d) Isolation Process

Semiconductor devices, which are completely produced after completion of solidification of resins in cavities, are independently isolated from frames.

(e) Sorting Process

In response to information produced in a sealing inspection process, semiconductor devices are subjected to sorting, in which good products are discriminated from defective products.

(f) Finishing Process

Good products are subjected to finishing, in which semiconductor devices are subjected to electrical circuit inspections, exterior finishing, and stamping, so that the finished semiconductor devices can be shipped.

(g) Sealing Inspection Process

Semiconductor devices are subjected to electrical conduction inspections, results of which are reflected in the sealing process and/or the sorting process.

In the above, the sealing inspection process is performed in the period of time after the completion of the mold setup process and before the completion of the sealing process, wherein monitoring is performed as to whether or not electrical conduction is detected between the lead formed in the frame and an electrode layer formed inside of the cavity of the mold unit. When an electrical conduction is detected, the inspection apparatus records an identification number of the cavity and an identification number assigned to an item (i.e., a semiconductor device) held inside of the cavity. With respect to the sealing process, the inspection apparatus generates an alert and signals for checking or controlling an operating condition of the cavity. With respect to the sorting process, the inspection apparatus generates a signal for removing the corresponding semiconductor device as a defective product from the manufacturing line.

Figure 18:
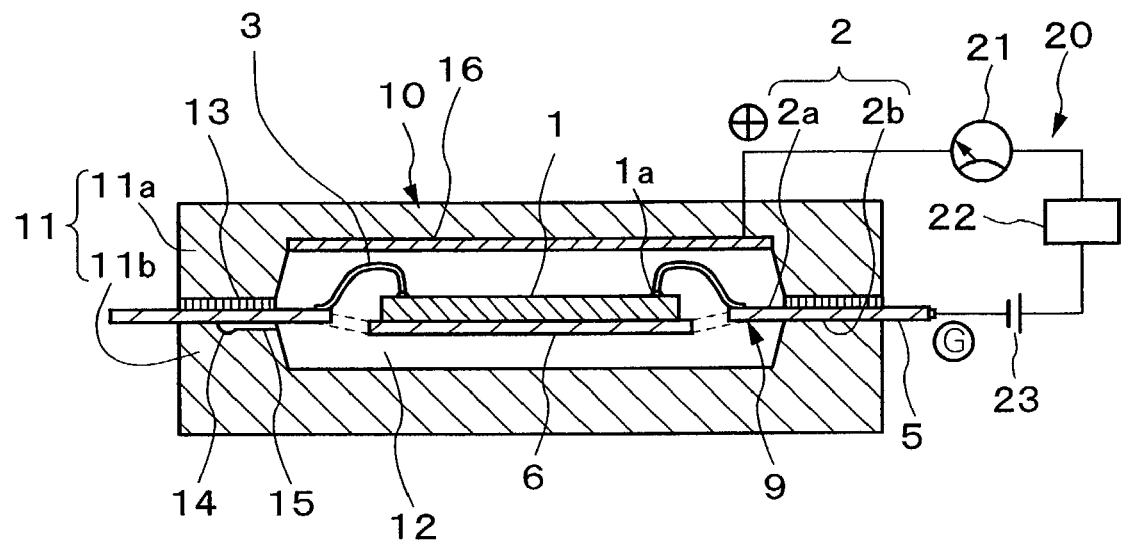
FIG. 18 is a cross sectional view showing the internal structure of a mold unit holding a frame assembly in accordance with a mold setup process of the manufacturing line shown in FIG. 17.

FIG. 18 is a cross sectional view showing the internal structure of a single mold unit that holds a frame assembly in a cavity in accordance with the mold setup process, which is shown in the aforementioned manufacturing line diagram of FIG. 17. For the sake of simplification of illustration, FIG. 18 shows a single mold unit, which corresponds to one unit of the mold assembly. Specifically, the mold unit 10 comprises the mold body 11 comprised of a pair of split molds 11a and 11b, the cavity 12, the runner 14 and gate 15 for used in injection of resin into the cavity 12, and an electrode layer 16. In addition, an inspection recorder 20 comprises a conduction detector 21, an identification recorder 22, and an electric power source 23.

The split molds 11a and 11b are controlled in temperature by the mold drive apparatus (not shown). In addition, when the frame assembly 9 is set into the cavity 12 of the mold unit 10, the external ends 2b of the leads 2 of the frame assembly 9 are held in an air tight manner between the split molds 11a and 11b at their split surfaces. Further, insulation layers 13 are formed on the split surfaces of the upper mold 11a towards which the bonding wires 3 are bent upwardly from the plane of the frame assembly 9. The insulation films 13 can be formed by films or paintings using the prescribed resin material such as fluororesin, silicone resin, and polyimide resin. Incidentally, the prescribed number of mold units are arranged adjacent to each other, wherein electrical insulation is secured between the upper molds of the adjacent mold units.

The cavity 12 contains the semiconductor chip 1, internal ends 2a of the leads 2, and bonding wires 3 of the frame assembly 9 in a non-contact manner, wherein the interior shape of the cavity 12 defines the exterior configuration of the package. The runner 14 and gate 15 construct a passage for use in injection of a resin (i.e., unhardened thermosetting resin compounds) into the cavity 12, wherein they are formed along the split surfaces of the split molds 11a and 11b. In addition, the other end of the runner 14 is communicated with a heating pot having a plunger, and the runner 15 is opened at the prescribed position of the cavity 12.

The electrode layer 16 is a conductive plate that is made of copper, titanium, or stainless steel, for example. The electrode layer 16 is attached to the prescribed interior wall of the upper mold 11a entirely. A line connected with the electrode layer 16 is extended from the upper mold 11a.

The inspection recorder 20 comprising the conduction detector 21, identification recorder 22, and power source 23 is arranged as circuitry formed between the electrode 16 and the frame 5. It is preferable that the frame 5 have a ground potential in connection with the above circuitry.

When the resistance between the electrode layer 16 and the frame 5 becomes lower than a prescribed threshold, the conduction detector 21 generates an auditory or visual alert and sends conduction data to the identification recorder 22. Then, the identification recorder 22 records an identification number of the cavity, electrical conduction of which is detected, and an identification mark assigned to an item (i.e., a semiconductor device) held in the cavity. With respect to the sealing process (see FIG. 17), the identification recorder 22 generates a signal for checking or controlling the operating condition of the cavity. With respect to the sorting process, it generates a signal for removing the corresponding semiconductor device as a defective product from the manufacturing line.

Next, details of the aforementioned processes will be described. In the frame assembly process, the semiconductor chip 1 is mounted on the stage 6 of the frame 5; then, the pads 1p of the semiconductor chip 1 are connected to the internal ends 2a of the leads 2 via the bonding wires 3, thus forming a frame assembly 9 shown in FIG. 3, wherein the bonding wires 3 are each formed like an arc having a curved top portion. The aforementioned manufacturing line uses a multiple frame assembly in which multiple units of frame assemblies (each shown in FIG. 3) are arranged in a matrix form in conformity with the arrangement of the cavities of the mold units. Optically readable serial numbers are respectively assigned to the frame assemblies that are arranged in the matrix form, so that the corresponding identification numbers are respectively assigned to the multiple units of the frame assemblies.

Figure 19:
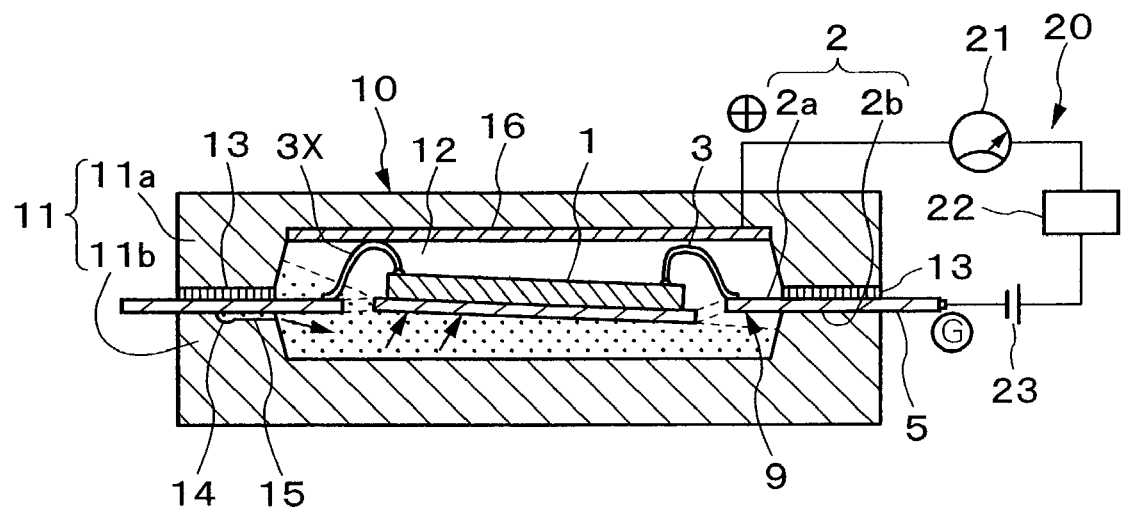
FIG. 19 is a cross sectional view showing the internal structure of the mold unit holding the frame assembly into which a resin is injected to unexpectedly press up a semiconductor chip together with bonding wires in accordance with a sealing process of the manufacture process shown in FIG. 17.

FIG. 19 shows the internal structure of the mold unit 10 holding the frame assembly 9 in the cavity 12, into which a resin is injected to seal the semiconductor chip 1 in accordance with the sealing process of the aforementioned manufacturing line shown in FIG. 17. That is, the frame assembly 9 is set into the mold unit 10 in the mold setup process; then, the mold unit 10 is closed and is subjected to the sealing process, in which a resin is injected into the cavity 12 via the runner 14 and gate 15, so that the cavity 12 is filled with the resin. Herein, the resin has a high viscosity and is hardened immediately after completion of the injection into the cavity 12 of the mold unit 10, which is heated at the prescribed temperature. Therefore, the resin is gradually increased in viscosity while flowing in the cavity 12. When the resin is solidified in the middle of the resin filling process, there is a possibility to cause occurrence of incompleteness of resin filling and occurrence of voids in the resin. Thus, the resin is injected into the gate 15 at a high pressure and at a high speed. Under such circumstances, when the semiconductor chip 1 is partially pressed upwardly by the flow pressure of the resin in the cavity 12, the curved top portions of the bonding wires 3 should be correspondingly pressed upwardly. In order to form the semiconductor device as compact as possible in size, gaps (or margins of distance) formed between the internal wall of the cavity 12 and the curved top portions of the bonding wires are approximately set to the prescribed allowable limits (e.g., 100□m). This may cause the unwanted situation where the curved top portion of the bonding wire 3X comes in contact with the electrode layer 16 attached to the interior wall of the cavity 12. When the curved top portion of any one of the bonding wire 3 comes in contact with the electrode layer 16 in the cavity 12, an electrical conduction should be established between the electrode layer 16 and the frame 5 because the frame 5 is connected with all the leads 2. Thus, the conduction detector 21 detects the electrically conducted state of the electrode layer 16 to visually display its magnitude as meter-reading, and it also sends conduction data to the identification recorder 22. The identification recorder 22 records the identification number of the cavity whose conduction is detected, and the identification number assigned to the item (i.e., semiconductor device) held in the cavity 12 as well as the serial number of the frame assembly corresponding to the item. Then, the identification recorder 22 generates several pieces of information required for the sealing process and the sorting process.

Figure 20A:
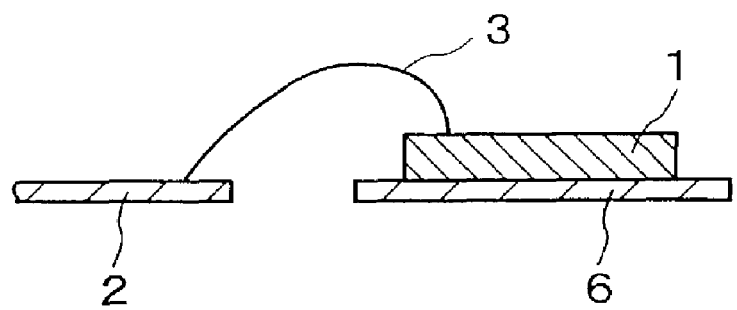
FIG. 20A shows an example of a bonding wire that is formed in an angular shape.
Figure 20B:
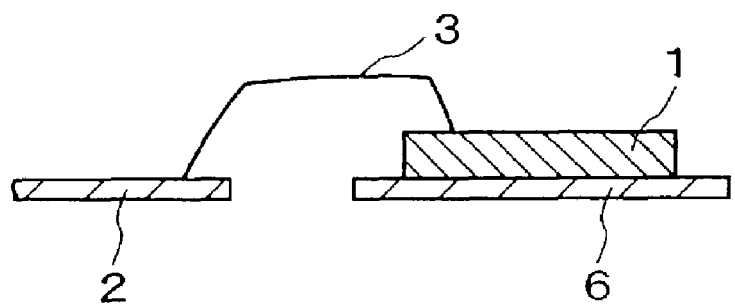
FIG. 20B shows another example of the bonding wire that is formed in a planar top shape.
Figure 20C:
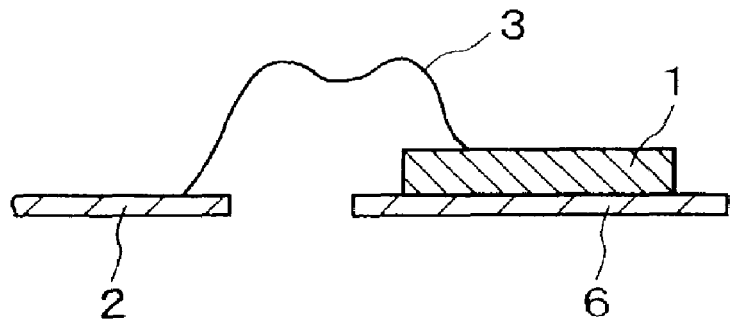
FIG. 20C shows a further example of the bonding wire that is formed in a double-peak top shape.

FIGS. 20A to 20C show examples of curved states of a bonding wire 3 for connecting the semiconductor chip 1 with the internal end of the lead 2. That is, the bonding wire 3 may be formed in a simple angular shape shown in FIG. 20A, a planar top shape shown in FIG. 20B, or a double-peak top shape shown in FIG. 20C, for example.

Figure 21:
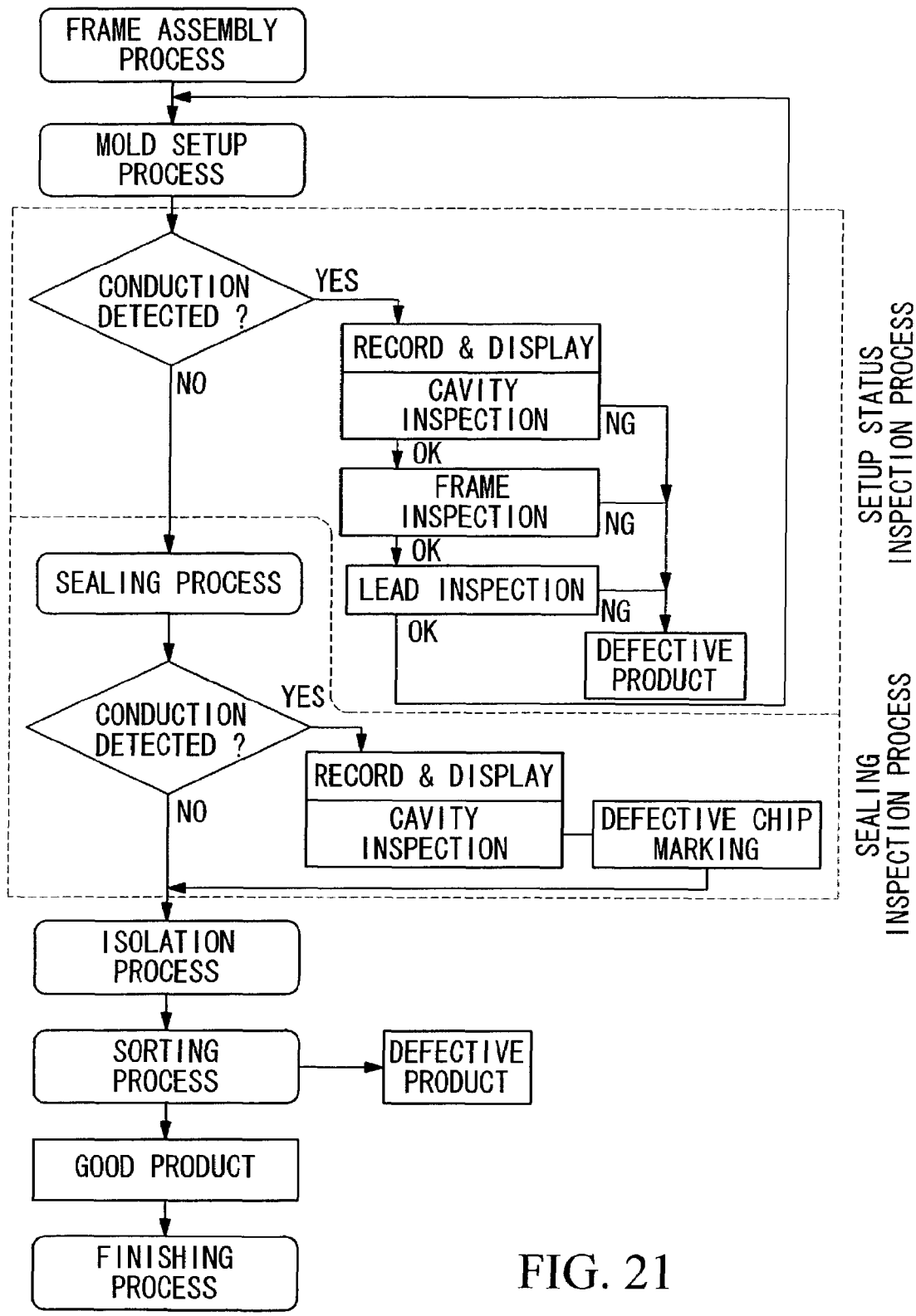
FIG. 21 is a manufacture flow diagram showing a modified example of the manufacturing line, which provides a setup status inspection process after the mold setup process.

FIG. 21 shows a modified example of the manufacturing line, which is characterized by further providing a setup status inspection process after the mold setup process in comparison with the aforementioned manufacturing line shown in FIG. 17. In the setup inspection process, detection is made as to whether or not an electrical conduction is established between the leads 2 and the electrode layer 16 in the cavity 12. When the electrical conduction is detected, the identification number of the cavity is recorded and is displayed on the screen of a display (not shown). In addition, a cavity inspection is performed by electrification as to whether or not the electrode layer 16 embedded in the mold unit 10 is placed in an insulated state. Specifically, the mold unit 10 is clamped while holding a dummy lead; then, electrical resistance is measured between the dummy lead and the line extended from the electrode layer 16. Alternatively, detection is performed with respect to an electrical conduction established between the upper mold 11a and the lower mold 11b. When a short-circuit is detected, it is possible to determine that foreign matter exists in the mold unit 10. Then, the inside space of the mold unit 10 should be cleaned.

After the mold unit 10 has passed the cavity inspection, it is subjected to a frame inspection, which is provided to remove defectiveness or abnormality of the frame 5 such as bending. This fame inspection is performed by measuring electrical resistances between the leads of the frame assembly, which were already subjected to bonding.

When the frame assembly 9 has passed the frame inspection, the leads 2 are subjected to a lead inspection, which is provided to remove defectiveness or abnormality of the leads 2 such as bending. This lead inspection is performed by measuring electrical resistances between the leads of the frame assembly, which were already subjected to bonding.

When passed the aforementioned inspections, the frame assembly is set into the mold unit 10 again; then, when no electrical conduction is detected in the mold unit, the frame assembly held in the mold unit is subjected to the sealing process, in which it is sealed with the resin. Thereafter, a conduction test is performed with respect to the sealed semiconductor device. When an electrical conduction is detected, the identification number of the cavity of the corresponding mold unit is recorded and is also displayed on the screen of the display, so that the displayed semiconductor device is subjected to the isolation process as a defective product. When no electrical conduction is detected, the semiconductor device is subjected to the isolation process as a good product, which was described before.

6. Sixth Embodiment

Next, a description will be given with respect to the sixth embodiment, which is basically similar to the fifth embodiment except configurations of molds, details of which will described below.

Figure 22:
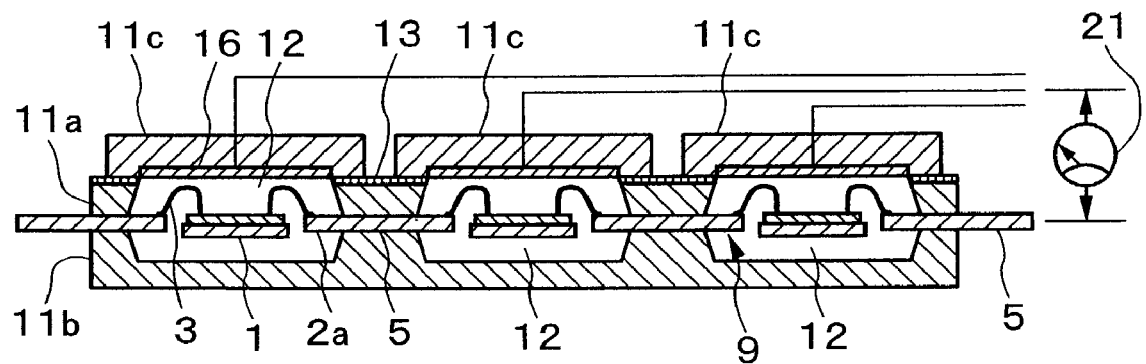
FIG. 22 is a cross sectional view showing structures of split molds holding frame assemblies in the mold setup process in accordance with a sixth embodiment of the invention.

FIG. 22 is a cross sectional view showing structures of split molds holding multiple frame assemblies in accordance with the mold setup process of the manufacturing line shown in FIG. 17. That is, the present embodiment employs a mold assembly that is split into three parts 11a, 11b, and 11c. Herein, these split molds 11a and 11b are combined together to integrally form a series of cavities 12 holding multiple units of frame assemblies respectively. Therefore, when set into the mold assembly, the multiple frame assembly 9 is held between the split molds 11a and 11b on their split surfaces. The split mold 11a sequentially arranges upper portions of the cavities 12, top portions of which are opened. The top portions of the split mold 11a except the top portions of the cavities 12 are respectively coated with insulation layers 13.

The other split molds 11c are isolated from each other and are arranged to cover the top portions of the cavities 12 respectively, wherein the bottom portions thereof are respectively placed on the insulation layers 13 formed on the top portions of the split molds 11a. Electrode layers 16 are respectively formed on the interior walls of the split molds 11c, so that they form top walls of the cavities 12 respectively. Lines are respectively extended from the electrode layers 16 and are connected with the aforementioned inspection recorder apparatus including the conduction detector 21 and power source (not shown), which forms the prescribed circuitry connected with the frame 5 of the frame assembly 9. The aforementioned inspection recorder apparatus including the conduction detector 21 sequentially scans the electrode layers 16 to perform monitoring, continuously during the sealing process, as to whether or not electrical conduction is established between each electrode layer 16 and the frame 5. Under the condition where the frame assembly 9 is set into the mold assembly and is held between the split molds 11a and 11b, all the electrode layers 16 are electrically insulated from the frame 5 by the insulation layers 13.

In the mold setup process, the multiple frame assembly 9 is set into the mold assembly shown in FIG. 22, which is initially opened and is then closed to define a series of cavities 12. In the sealing process, resins are injected into these cavities 12 by way of a runner communicated with a heating pot having a plunger (not shown). Due to differences of traveling of the runner for injecting resins into the cavities 12, variations may occur in pressures and speeds of injection of resins into the respective cavities 12. Therefore, the semiconductor chip 1 may be pressed upwardly in a certain cavity 12, in which curved top portions of bonding wires 3 will be unexpectedly brought into contact with the top wall corresponding to the electrode layer 16. Due to contacts established between the bonding wires 3 and the electrode layer 16 in the cavity 12, an electrical conduction is correspondingly established between the electrode layer 16 and the frame assembly 9. Since scanning is performed independently with respect to each of the cavities 12, the inspection recorder apparatus can recognize and record the identification number of the cavity in which an electrical conduction is detected, as well as the serial number of the frame assembly set into the cavity, and the number of the individual unit.

7. Seventh Embodiment

A description will be given with respect to the seventh embodiment, which is basically similar to the fifth embodiment except configurations of molds, details of which will be described below.

Figure 23:
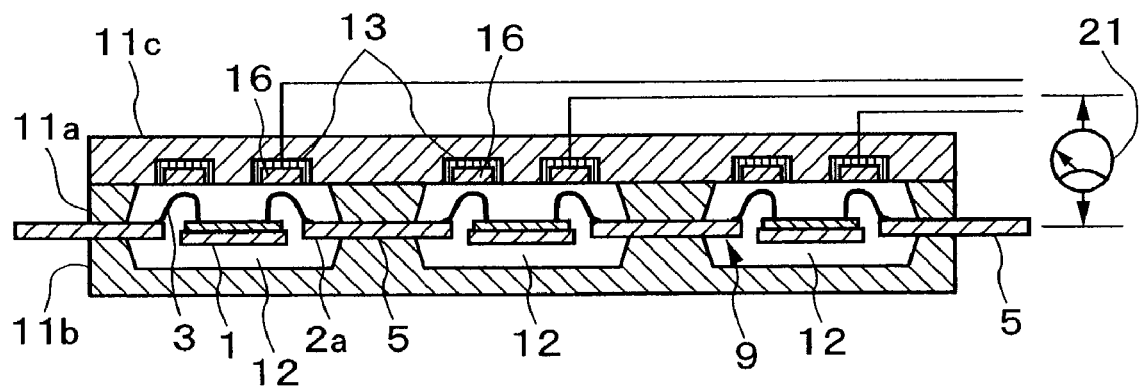
FIG. 23 is a cross sectional view showing structures of split molds holding frame assemblies in the mold setup process in accordance with a seventh embodiment of the invention.

FIG. 23 is a cross sectional view showing structures of split molds holding multiple frame assemblies in accordance with the mold setup process. That is, the present embodiment employs a mold assembly that is split into three parts 11a, 11b, and 11c. These split molds 11a, 11b, and 11c are combined together to integrally form a series of cavities 12 holding multiple units of frame assemblies respectively. Herein, the multiple frame assembly 9 is set into the mold assembly and is held between the split molds 11a and 11b on their split surfaces. The split mold 11a sequentially arranges upper portions (or side walls) of the cavities 12, top portions of which are opened.

Figure 24:
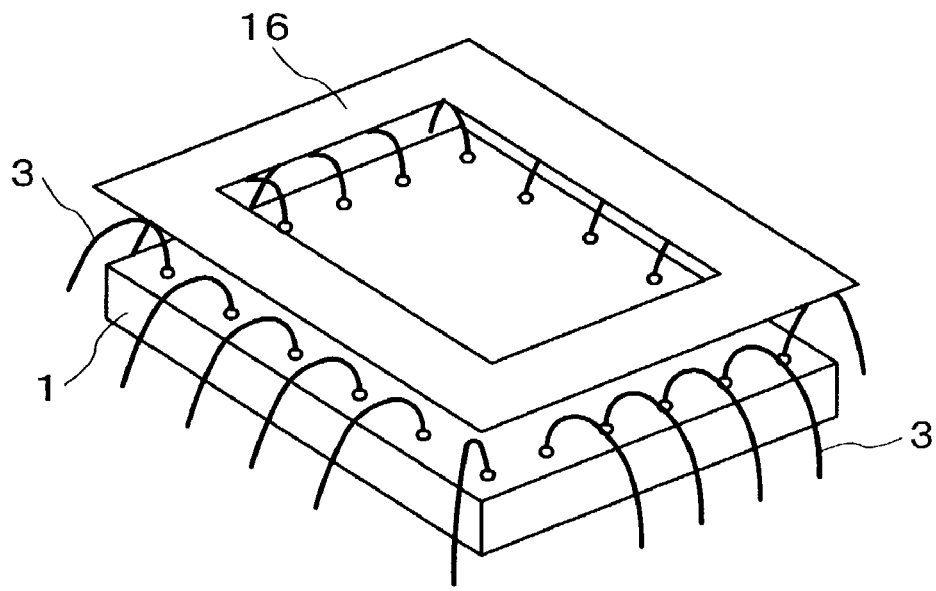
FIG. 24 is a perspective view showing an arrangement of an electrode layer relative to a semiconductor chip in each cavity.

The other split mold 11c is mounted on the split mold 11a to collectively cover the top portions of the cavities 12. The split mold 11c arranges electrode layers 16 in conformity with the top portions of the cavities 12 respectively, wherein the electrode layers 16 are electrically insulated from the split mold 11c via insulation layers 13. These electrode layers 16 occupies prescribed parts of the interior wall of the split mold 11c, which corresponds to the upper walls of the cavities 12, wherein they are arranged in proximity to the curved top portions of the bonding wires 3 in the cavities 12 respectively. That is, the electrode layers 16 are embedded in hollow portions of the split mold 11c, and they are each arranged as shown in FIG. 24. Lines are respectively extended from the electrode layers 16 respectively and are connected with the aforementioned inspection recorder apparatus including the conduction detector 21 and power source, which forms the prescribed circuitry connected with the frame 5 of the frame assembly 9. The inspection recorder apparatus sequentially scans the electrode layers 16 to perform monitoring, continuously during the sealing process, as to whether or not an electrical conduction is established between each electrode layer 16 and the frame 5. Under the condition where the multiple frame assembly 9 is set into the mold assembly and is held between the split molds 11a and 11b, all the electrode layers 16 are electrically insulated from the frame 5 via the insulation layers 13.

In the mold setup process, the frame assembly 9 is set into the mold assembly, which is initially opened and is then closed. In the sealing process, resins are injected into a series of cavities 12. Due to variations of pressures and speeds of injection of resins into the cavities 12, when the semiconductor chip 1 is pressed upwardly in a certain cavity 12, the curved top portions of the bonding wires 3 may be unexpectedly brought into contact with the top walls of the cavity 12. Since the electrode layers 16 are arranged in proximity to the curved top portions of the bonding wires 3, the curved top portions of the bonding wires 3 may be brought into contact with the electrode layers 16. In this case, an electrical conduction established between the electrode layer(s) 16 and the frame assembly 9 is detected with respect to each cavity 12. Thus, the inspection recorder apparatus can recognize and record the identification number of the cavity 12, in which the electrical conduction is detected, as well as the serial number of the frame assembly set into the cavity, and the number of the individual unit.

The present embodiment is advantageous in that minimal areas of electrode layers are required for detection and inspection. Thus, it is possible to minimize occurrence of troubles due to discrepancies between expansion coefficients and heat transmission coefficients, which may be possibly caused when the internal walls of the cavities are occupied by prescribed materials other than metal materials.

8. Eighth Embodiment

The eighth embodiment relates to a method for detecting specific failures in which curved top portions of bonding wires are abnormally approached to the surface of a package, wherein the eighth embodiment is basically similar to the fifth embodiment except the structure of a frame assembly, details of which will be described below.

Figure 25:
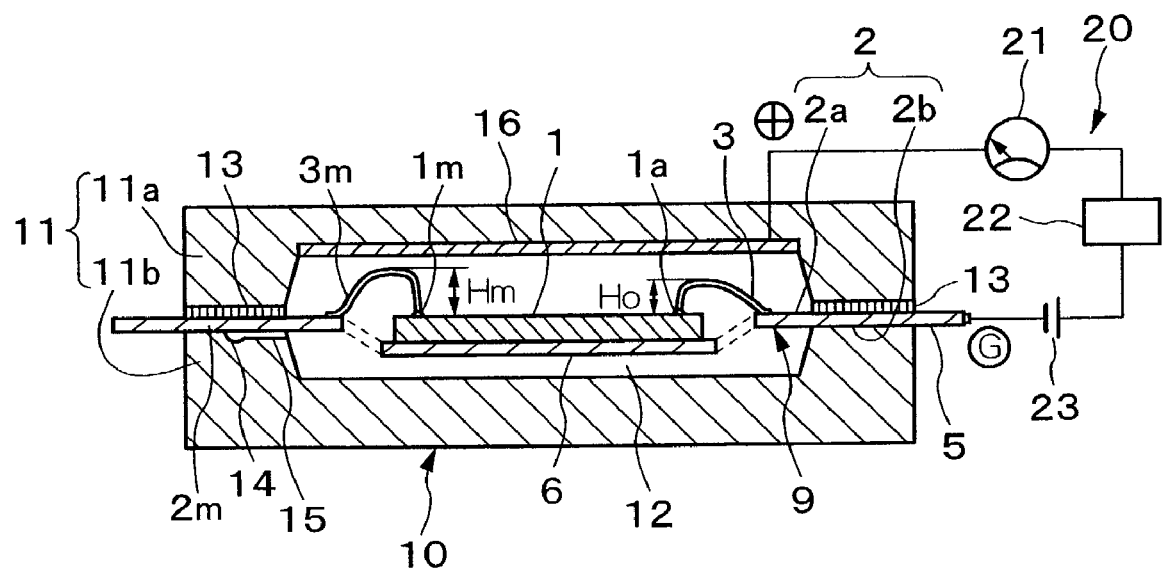
FIG. 25 is a cross sectional view showing a mold unit holding a frame assembly in the mold setup process in accordance with an eighth embodiment of the invention.
Figure 26:
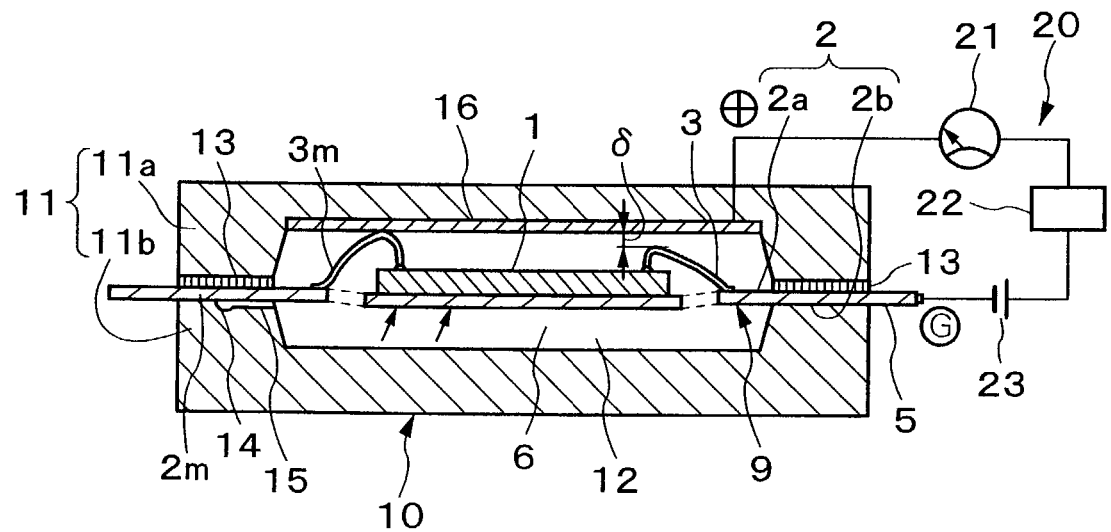
FIG. 26 is a cross sectional view showing the mold unit holding the frame assembly sealed with a resin in the sealing process in accordance with the eight embodiment of the invention.

FIG. 25 is a cross sectional view showing the internal structure of a mold unit 10 holding a single unit of a frame assembly 9 in accordance with the eighth embodiment of the invention. The semiconductor chip 1 mounted on the stage 6 of the frame assembly 9 has at least one detection pad 1m in addition to the general-use pads 1a for interconnections with the circuitry, while the frame 5 of the frame assembly 9 are interconnected with at least one detection lead 2m in addition to the general-use leads 2 for interconnections with the circuitry, wherein the detection pad 1m is interconnected with the internal end of the detection lead 2m via a detection bonding wire 3m. Herein, the detection pad 1m is not necessarily connected with circuitry of the semiconductor chip 1, wherein it is preferable to connect the detection pad 1m with the ground line of the circuitry. In addition, it is possible to use a specific lead, which is normally grounded, for the purpose of detection without independently providing the detection lead 2m.

In the above, the detection lead 3m is shaped like an arc having a curved top portion in conformity with the general-use bonding wires 3 connected with the semiconductor chip 1, wherein these bonding wires differ from each other in heights measured from the surface of the semiconductor chip 1. That is, the height Hm of the curved top portion of the detection bonding wire 3m is set higher than the height Ho of the curved top portion of the general-use bonding wire 3. Herein, the difference of height 'Hm-Ho' is set within margins of minimum allowable limit value 'δ', which is allowed between the top portions of the bonding wires and the exterior surface of the package of the manufactured semiconductor device. In the present embodiment, the height Ho of the general-use bonding wire 3 is set to 175 μm, and the minimum allowable limit value δ is set to 100 μm, so that the height Hm of the detection bonding wire 3m is set to 275 μm.

The eighth embodiment can use any one of the aforementioned molds as defined in the fifth to seventh embodiments. For the sake of convenience, the eighth embodiment will be described by use of the mold unit as defined in the fifth embodiment (see FIG. 18).

In the mold setup process, the frame assembly 9 is set into the cavity 12 of the mold unit 10 in conformity with the split surfaces of the split molds 11a and 11b, which are initially opened and is then closed. At this stage, a gap is formed between the curved top portion of the detection bonding wire 3m and the electrode layer 16 formed on the interior wall of the cavity 12. Therefore, no electrical conduction is detected between the electrode layer 16 and the frame 5.

In the sealing process, a resin is injected into the cavity 12 of the mold unit 10. When the semiconductor chip 1 is moved upwardly due to the flow pressure of the resin in the cavity 12, the detection boding wire 3m whose curved top portion has a higher height compared with the heights of the other bonding wires 3 must be firstly brought into contact with the electrode layer 16 as shown in FIG. 24. Such contact causes an electrical conduction between the electrode layer 16 and the frame 5. Thus, the conduction detector 21 detects it to generate an alert and to send conduction data to the identification recorder 22. The identification recorder 22 records the identification number of the cavity 12, in which an electrical conduction is detected, as well as the serial number of the frame assembly 9 set into the cavity 12, and the number of the individual unit. With respect to the sealing process, it generates a signal for checking or controlling the operating condition of the cavity 12. With respect to the sorting process, it generates a signal for removing the corresponding semiconductor device as a defective product or re-inspected product from the manufacturing line.

In the aforementioned semiconductor device removed from the manufacturing line, the difference between the curved top portion of the bonding wire(s) 3 and the surface of the package is equal to the minimal allowable limit value δ or less; that is, a margin of error regarding the surface of the package becomes equal to 100 μm or less. According to the present embodiment, even though the bonding wire(s) is apparently exposed from the surface of the package, it is possible to reliably remove from the manufacturing line the fragile semiconductor devices whose bonding wires may be possibly exposed when exterior surfaces of packages are peeled off after shipment and low-precision semiconductor devices whose properties are deteriorated when humidity are infiltrated into thinned portions of surfaces of packages.

Incidentally, the present embodiment is not necessarily designed to provide a single detection bonding wire but to provide multiple detection bonding wires with respect to each semiconductor device at different positions. When multiple detection bonding wires having different heights are arranged at four corners of the semiconductor chip, it is possible to specify defective portions of the semiconductor chip. Thus, it is possible to detect a degree of defectiveness, and it is possible to discriminate semiconductor devices having relatively low degrees of defectiveness from other products.

Furthermore, it is possible to forcibly form traces on exterior surfaces of products of semiconductor devices, which are manufactured using the aforementioned chip fixing members 13 shown in FIGS. 7, 8, and 10. In the case of the chip fixing member 13 shown in FIG. 7, a relatively large circular trace may be forcibly formed on the center area of the exterior surface of the semiconductor device. In the case of the chip fixing members 13 shown in FIG. 8 or FIG. 10, four traces each corresponding to a small circle are formed at four corners of the exterior surface of the semiconductor device. These traces can be used for distinctions for products of semiconductor devices manufactured by the aforementioned embodiments.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An inspection method for a semiconductor device in which a semiconductor chip connected with leads whose internal ends are interconnected with bonding wires is sealed in a resin corresponding to a package while external ends of the leads are exposed outside of the package, comprising the steps of:

forming an electrode layer on an internal wall of a cavity of a mold unit, into which the resin is injected to form the package, wherein the electrode layer is arranged to be electrically insulated from each of the leads;

detecting whether or not an electrical conduction is established between the electrode layer and each of the leads; and upon detection of the electrical conduction, recognizing that at least one bonding wire is exposed from the surface of the package in the semiconductor device molded in the cavity.

2. An inspection method for a semiconductor device in which a semiconductor chip connected with leads whose internal ends are interconnected with bonding wires is sealed in a resin corresponding to a package while external ends of the leads are exposed outside of the package, comprising the steps of:

providing at least one detection bonding wire that is interconnected with at least one detection lead arranged for the semiconductor chip, wherein the detection boding wire has a curved top portion whose height is higher than heights of curved top portions of the other bonding wires in a cavity of a mold unit;

forming an electrode layer on an interior wall of the cavity of the mold unit into which the resin is injected, wherein the electrode layer is electrically insulated from the detection lead and each of the other leads;

detecting whether or not an electrical conduction is established between the electrode layer and the detection lead; and upon detection of the electrical conduction, recognizing that the curved top portions of the other bonding wires are abnormally approached to the surface of the package beyond a prescribed allowable limit value.

3. A manufacturing method of a semiconductor device in which a semiconductor chip connected with leads whose internal ends are inter connected with bonding wires is sealed in a resin corresponding to a package while external ends of the leads are exposed outside of the package, said manufacturing method comprising the steps of:

performing a mold setup process in which a frame assembly comprising the semiconductor chip, which is mounted on a frame having eh leads in such a way that the semiconductor chip is interconnected with the internal ends of the leads by the bonding wires, is set into a cavity of a mold unit in such a way that the external ends of the leads are exposed outside while the internal ends of the leads and the bonding wires are bridged across the cavity;

performing a resin filling process in which a resin for use in formation of a package is injected into the cavity;

performing a resin fixation process in which the resin completely filling the cavity is subjected to solidification; and performing detection as to whether or not an electrical conduction is established between the lead and an electrode, which is formed on an interior surface of the cavity and is electrically insulated form the leads.

4. The manufacturing method of a semiconductor device in according to claim 3, wherein the frame assembly further comprises a detection bonding wire whose top portion is arranged higher than top portions of the other bonding wires and in which one end is interconnected with the semiconductor chip and the other end is interconnected with a detection lead, and wherein in the resin filling process, detection is performed as to whether or not an electrical conduction is established between the electrode and the detection lead.

* * * * *